United States Patent
Hwang et al.

(10) Patent No.: US 12,388,921 B2
(45) Date of Patent: Aug. 12, 2025

(54) ELECTRONIC DEVICE HOUSING WITH PROTRUSIONS AND ELECTRONIC DEVICE INCLUDING THE SAME

(71) Applicant: Samsung Electronics Co., Ltd., Gyeonggi-do (KR)

(72) Inventors: Hangyu Hwang, Gyeonggi-do (KR); Changsu Kim, Gyeonggi-do (KR); Sangsik Na, Gyeonggi-do (KR); Yeonghwan Gong, Gyeonggi-do (KR); Hyunjung Jung, Gyeonggi-do (KR); Sungho Cho, Gyeonggi-do (KR); Junpil Kim, Gyeonggi-do (KR); Jinho Kim, Gyeonggi-do (KR); Jinshik Lim, Gyeonggi-do (KR); Jungho Hwang, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 411 days.

(21) Appl. No.: 17/864,979

(22) Filed: Jul. 14, 2022

(65) Prior Publication Data

US 2023/0038052 A1 Feb. 9, 2023

Related U.S. Application Data

(63) Continuation of application No. PCT/KR2022/007925, filed on Jun. 3, 2022.

(30) Foreign Application Priority Data

Aug. 3, 2021 (KR) .................. 10-2021-0102091

(51) Int. Cl.
*H04M 1/02* (2006.01)
*G06F 1/16* (2006.01)
(Continued)

(52) U.S. Cl.
CPC .................. *H04M 1/0283* (2013.01)

(58) Field of Classification Search
CPC .................. H04M 1/0283; B32B 3/30
See application file for complete search history.

(56) References Cited

U.S. PATENT DOCUMENTS

2013/0257237 A1 10/2013 Cao et al.
2016/0052227 A1* 2/2016 Takihara ............ B32B 27/06
428/141
(Continued)

FOREIGN PATENT DOCUMENTS

CN 211378445 U * 8/2020 ............ B32B 33/00
KR 10-1042501 B1 6/2011
(Continued)

OTHER PUBLICATIONS

CN-211378445 U, machine translation (Year: 2020).*
(Continued)

*Primary Examiner* — Frank J Vineis
*Assistant Examiner* — Nicole T Gugliotta
(74) *Attorney, Agent, or Firm* — Cha & Reiter, LLC.

(57) ABSTRACT

According to certain embodiments, an electronic device housing comprises: a substrate including: a front surface comprising a plurality of front surface protrusions and a plurality of taper protrusions protruding from the plurality of front surface protrusions and a rear surface comprising a plurality of rear surface protrusions; and wherein two protrusions selected from the plurality of front surface protrusions, the plurality of taper protrusions, and the plurality of rear surface protrusions are different from each remaining ones of the plurality of front surface protrusions, the plurality of taper protrusions, and the plurality of rear surface
(Continued)

protrusions; a deposition layer formed on the front surface of the substrate; and a transparent coating layer formed on the rear surface of the substrate.

18 Claims, 11 Drawing Sheets

(51) Int. Cl.
*H05K 5/00* (2025.01)
*H05K 5/02* (2006.01)
*H05K 5/03* (2006.01)

(56) References Cited

U.S. PATENT DOCUMENTS

| | | | |
|---|---|---|---|
| 2016/0101589 A1* | 4/2016 | Ozawa | B32B 27/302 |
| | | | 428/141 |
| 2019/0291504 A1* | 9/2019 | Cho | G02B 5/0257 |
| 2020/0198294 A1 | 6/2020 | Lee et al. | |

FOREIGN PATENT DOCUMENTS

| | | |
|---|---|---|
| KR | 10-1167708 B1 | 7/2012 |
| KR | 10-1167709 B1 | 7/2012 |
| KR | 10-2013-0012783 A | 2/2013 |
| KR | 10-2013-0100667 A | 9/2013 |
| KR | 10-1396402 B1 | 5/2014 |
| KR | 10-2018-0064610 A | 6/2018 |
| KR | 10-2044116 B1 | 11/2019 |
| WO | 2018/164463 A1 | 9/2018 |

OTHER PUBLICATIONS

Omnexus, Comprehensive Guide on Polymethyl methacrylate (PMMA or acrylic) https://omnexus.specialchem.com/selection-guide/polymethyl-methacrylate-pmma-acrylic-plastic (Year: 2021).*
International Search Report Dated Sep. 13, 2022.
Extended European Search Report dated Nov. 28, 2024.

* cited by examiner

ELECTRONIC DEVICE HOUSING WITH PROTRUSIONS AND ELECTRONIC DEVICE INCLUDING THE SAME

CROSS-REFERENCE TO RELATED APPLICATIONS

This application is a continuation of International Application No. PCT/KR2022/007925 designating the United States, filed on Jun. 3, 2022, in the Korean Intellectual Property Receiving Office and claiming priority to Korean Patent Application No. 10-2021-0102091, filed on Aug. 3, 2021, in the Korean Intellectual Property Office, the disclosures of which are incorporated by reference herein in their entireties.

BACKGROUND

1. Field

The disclosure relates to an electronic device housing with protrusions, and an electronic device including the same.

2. Description of Related Art

An electronic device can be a device that performs a specific function according to a loaded program, such as a home appliance, an electronic note, a portable multimedia player, a mobile communication terminal, a tablet personal computer (PC), a video/audio device, a desktop/laptop computer, a vehicle navigation system, and the like. For example, such electronic devices may output stored information as sound or images. Along with an increase in the integration level of electronic devices and the increasing popularity of ultra-high-speed, large-capacity wireless communication, various functions have recently been loaded in a single electronic device, such as a mobile communication terminal. For example, an entertainment function such as gaming, a multimedia function such as music/video play, a communication and security function for mobile banking, a scheduling function, and an electronic wallet function, as well as a communication function, have been integrated into a single electronic device.

An electronic device can include a housing formed of various materials. The housing of the electronic device may protect internal components of the electronic device from an external impact. In addition, the housing may be manufactured to be easily carried by a user. Additionally, the housing can be made to be aesthetically pleasing to the user. The housing may need to have a high strength and hardness to protect multiple internal components and modules of the electronic device, and may have excellent gloss for a quality of an exterior of the electronic device.

An exterior surface of the housing (or a case) may also have be visually pleasing to differentiate from other electronic devices.

If a film (e.g., a deco film) is added to the surface of the housing, it is important to be attached evenly to a corner or a curved surface in which several faces meet to avoid folding or wrinkling.

SUMMARY

According to certain embodiments, an electronic device housing comprises: a substrate including: a front surface comprising a plurality of front surface protrusions and a plurality of taper protrusions protruding from the plurality of front surface protrusions and a rear surface comprising a plurality of rear surface protrusions; and wherein two protrusions selected from the plurality of front surface protrusions, the plurality of taper protrusions, and the plurality of rear surface protrusions are different from each remaining ones of the plurality of front surface protrusions, the plurality of taper protrusions, and the plurality of rear surface protrusions; a deposition layer formed on the front surface of the substrate; and a transparent coating layer formed on the rear surface of the substrate. According to certain embodiments, an electronic device housing comprises: a substrate including: a front surface comprising a plurality of front surface protrusions; and a rear surface comprising a plurality of rear surface protrusions and a plurality of taper protrusions protruding from the plurality of rear surface protrusions; and wherein two protrusions selected from the plurality of front surface protrusions, rear surface protrusions, and taper protrusions are different from each remaining one of the plurality of front surface protrusions, plurality of rear surface protrusions, and plurality of taper protrusions; and a deposition layer formed on the front surface of the substrate; and a transparent coating layer formed on the rear surface of the substrate. According to certain embodiments, an electronic device enclosed by an electronic device housing, wherein the electronic device housing comprises: a substrate including: a front surface comprising a plurality of front surface protrusions and a plurality of taper protrusions protruding from the plurality of front surface protrusions, and a rear surface comprising a plurality of rear surface protrusions; and wherein two protrusions selected from the plurality of front surface protrusions, the plurality of taper protrusions, and the plurality of rear surface protrusions are different from remaining ones of the plurality of front surface protrusions, the plurality of taper protrusions, and the plurality of rear surface protrusions; a deposition layer formed on the front surface of the substrate; and a transparent coating layer formed on the rear surface of the substrate.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
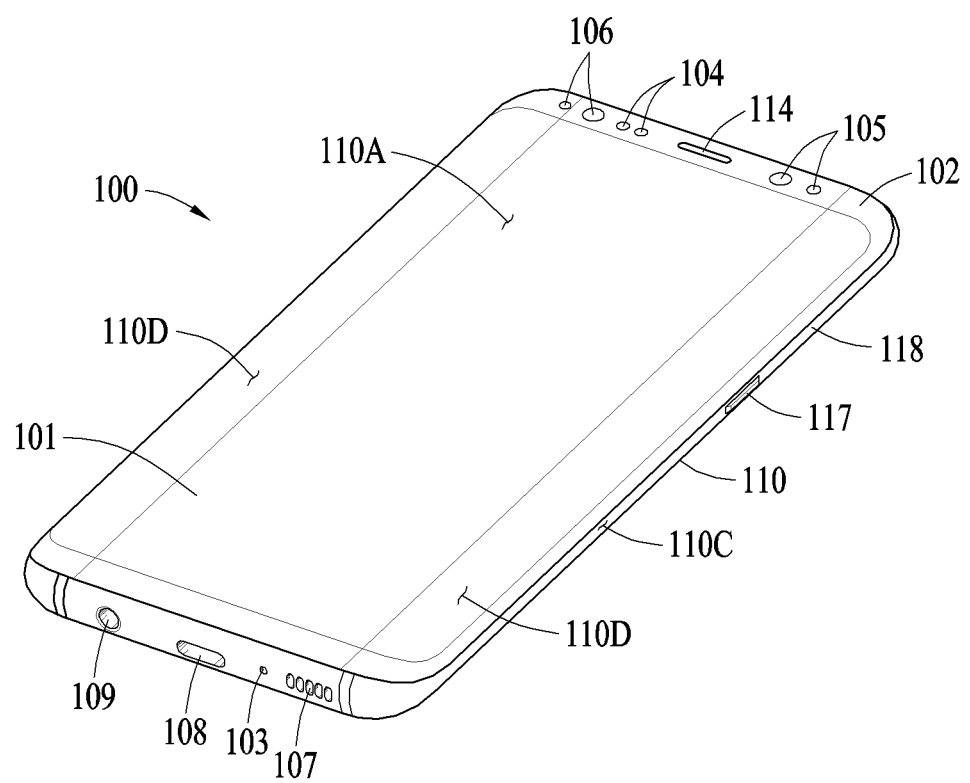
FIG. 1 is a perspective view of a front surface of a mobile electronic device according to an example embodiment.

Hereinafter, example embodiments will be described in detail with reference to the accompanying drawings. When describing the example embodiments with reference to the accompanying drawings, like reference numerals refer to like elements and a repeated description related thereto will be omitted.

Certain embodiments provide an electronic device housing that may realize a visual surface texture without a limitation of a surface shape, and an electronic device including the same.

Certain embodiments provide an electronic device housing on which a surface pattern having a sense of perspective is formed, and an electronic device including the same.

An electronic device housing according to certain embodiments may include a front surface including a plurality of protrusions, and a rear surface including a plurality of protrusions. The plurality of protrusions may be different from each other in at least one of a width, a depth, and a pitch.

An electronic device according to certain embodiments may be enclosed by an electronic device housing, and the electronic device housing may include a plurality of protrusions formed on a surface of the electronic device housing.

A method of manufacturing an electronic device housing according to certain embodiments may include preparing a mold including a plurality of intaglio patterns, injection molding a housing using the mold, forming a transparent coating layer on one surface of the housing, and forming at least one of a deposition layer, a paint layer, and a shielding layer on an opposite surface of the housing.

Figure 2:
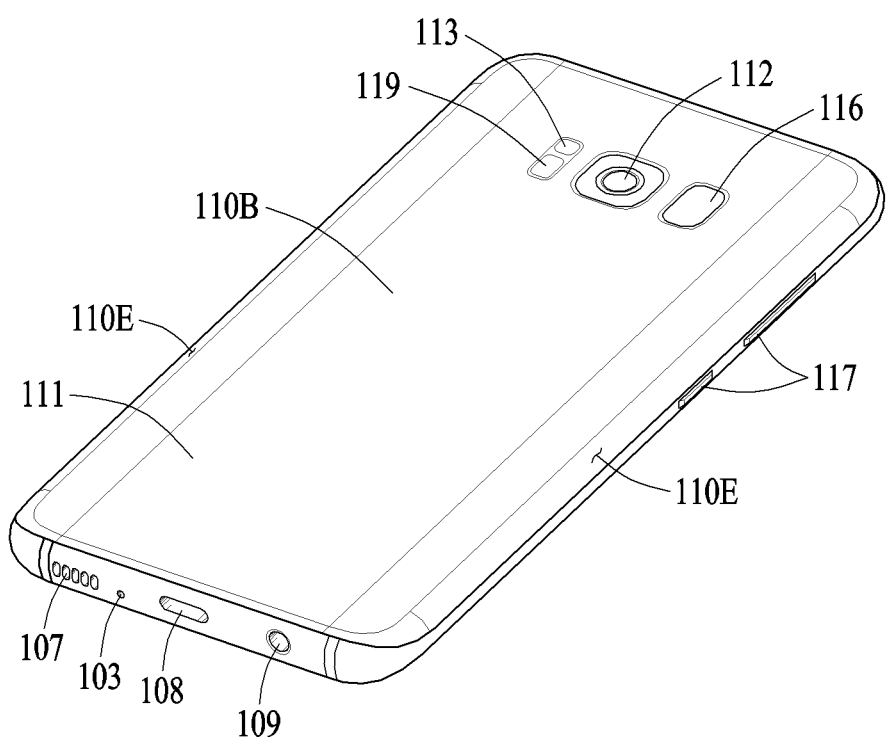
FIG. 2 is a perspective view of a rear surface of the electronic device of FIG. 1.

FIGS. 1 and 2 describe a housing of an electronic device 100. The housing 110 of the electronic device 100 may protect internal components of the electronic device 100 from an external impact. In addition, the housing 110 may be manufactured to be easily carried by a user. Additionally, the housing 110 can be made to be aesthetically pleasing to the user. The housing 110 may need to have a high strength and hardness to protect multiple internal components and modules of the electronic device 100, and may have excellent gloss for a quality of an exterior of the electronic device.

An exterior surface 110A, 110B of the housing (or a case) may have be visually pleasing to differentiate from other electronic devices.

Housing

FIG. 1 is a perspective view of a front surface of a mobile electronic device according to an example embodiment.

FIG. 2 is a perspective view of a rear surface of the electronic device of FIG. 1.

Referring to FIGS. 1 and 2, an electronic device 100 according to an embodiment may include a housing 110 including a first surface (or a front surface) 110A, a second surface (or a rear surface) 110B, and a side surface 110C surrounding a space between the first surface 110A and the second surface 110B. In an example embodiment (not shown), the housing may also refer to a structure which forms a portion of the first surface 110A, the second surface 110B, and the side surface 110C of FIG. 1. According to an example embodiment, the first surface 110A may be formed by a front plate 102 (e.g., a glass plate or a polymer plate including various coating layers) of which at least a portion is substantially transparent. The second surface 110B may be formed of a rear plate 111 that is substantially opaque. For example, the rear plate 111 may be formed of coated or colored glass, ceramic, polymer, metal materials (e.g. Aluminum, stainless steel (SS), or magnesium) or a combination of at least two of the above materials. The side surface 110C may be coupled to the front plate 102 and the rear plate 111 and may be formed by a side bezel structure (or a "side member") 118 including a metal and/or a polymer. In an example embodiment, the rear plate 111 and the side bezel structure 118 may be integrally formed and may include the same material (e.g., a metal material such as aluminum).

In the illustrated example embodiment, the front plate 102 may include two first areas 110D that are curved and extended seamlessly from the first surface 110A toward the rear plate 111 at both ends of a long edge of the front plate 102. In the illustrated example embodiment (see FIG. 2), the rear plate 111 may include two second areas 110E that are curved and extended seamlessly from the second surface 110B toward the front plate 102 at both ends of a long edge thereof. In some example embodiments, the front plate 102 (or the rear plate 111) may include only one of the first areas 110D (or the second areas 110E). In an example embodiment, some of the first areas 110D or the second area 110E may not be included. In the above example embodiments, in a side view of the electronic device 100, the side bezel structure 118 may have a first thickness (or width) at a side in which the first areas 110D or the second areas 110E are not included, and may have a second thickness less than the first thickness at a side in which the first areas 110D or the second areas 110E are included.

According to an example embodiment, the electronic device 100 may include at least one of a display 101, audio modules 103, 107, and 114, sensor modules 104, 116, and 119, camera modules 105, 112, and 113, key input devices 117, a light-emitting element 106, and connector holes 108 and 109. In some example embodiments, the electronic device 100 may not include at least one (e.g., the key input devices 117 or the light-emitting element 106) of the components, or may additionally include other components.

The display 101 may be exposed through, for example, some portions of the front plate 102. In some example embodiments, at least a portion of the display 101 may be exposed through the first surface 110A and the front plate 102 constructing the first areas 110D of the side surface 110C. In some example embodiments, an edge of the display 101 may be formed to be substantially the same as the shape of the periphery of the front plate 102 adjacent thereto. In another example embodiment (not shown), in order to enlarge the exposed area of the display 101, a distance between the edge of the display 101 and the periphery of the first plate 102 may be substantially the same.

In an example embodiment (not shown), a recess or an opening may be formed in a portion of a screen display area of the display 101, and at least one of the audio module 114, the sensor module 104, and the camera module 105, the light-emitting element 106 that are aligned with the recess or the opening may be included. In an example embodiment (not shown), a rear surface of the screen display area of the display 101 may include at least one of the audio module 114, the sensor module 104, the camera module 105, the sensor module 116 (e.g., a fingerprint sensor), and the light-emitting element 106. In an example embodiment (not shown), the display 101 may be coupled to or disposed adjacent to a touch sensing circuit, a pressure sensor for measuring an intensity (pressure) of a touch, and/or a digitizer for detecting a magnetic-type stylus pen. In some example embodiments, at least a portion of the sensor modules 104 and 119, and/or at least a portion of the key input device 117 may be disposed in the first areas 110D and/or the second areas 110E.

The audio modules 103, 107, and 114 may include a microphone hole (e.g., the audio module 103) and speaker holes (e.g., the audio modules 107 and 114). A microphone for acquiring an external sound may be disposed in the microphone hole (e.g., the audio module 103). In some example embodiments, a plurality of microphones may be disposed to detect a direction of a sound. The speaker holes (e.g., the audio modules 107 and 114) may include an external speaker hole (e.g., the audio module 107), and a receiver hole (e.g., the audio module 114) for a call. In some example embodiments, the speaker holes (e.g., the audio modules 107 and 114) and the microphone hole (e.g., the audio module 103) may be implemented as a single hole, or a speaker (e.g., a piezo speaker) may be included without the speaker holes (e.g., the audio modules 107 and 114).

The sensor modules 104, 116, and 119 may generate an electrical signal or a data value corresponding to an internal operating state of the electronic device 100 or an external environmental state. The sensor modules 104, 116, and 119 may include, for example, a first sensor module 104 (e.g., a proximity sensor) and/or a second sensor module (not shown) (e.g., a fingerprint sensor) disposed on the first surface 110A of the housing 110, and/or a third sensor module 119 (e.g., a heart rate monitoring (HRM) sensor) and/or a fourth sensor module 116 (e.g., a fingerprint sensor) disposed on the second surface 110B of the housing 110. The fingerprint sensor may be disposed on both the first surface 110A (e.g., the display 101) and the second surface 110B of the housing 110. The electronic device 100 may further include at least one of sensor modules (not shown), for example, a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, and an illuminance sensor 104.

The camera modules 105, 112, and 113 may include a first camera device 105 disposed on the first surface 110A of the electronic device 100, a second camera device 112 disposed on the second surface 110B, and/or a flash 113. The camera modules 105 and 112 may each include one or more lenses, an image sensor, and/or an image signal processor. The flash 113 may include, for example, a light-emitting diode (LED) or a xenon lamp. In some example embodiments, two or more lenses (e.g., IR camera, wide-angle, and telephoto lenses) and image sensors may be disposed on one surface of the electronic device 100.

The key input device 117 may be disposed on the side surface 110C of the housing 110. In an example embodiment, the electronic device 100 may not include some or all of the above-described key input devices 117. The key input device 117 that is not included may be implemented in another form such as a soft key on the display 101. In some example embodiments, the key input device 117 may include the sensor module 116 disposed on the second surface 110B of the housing 110.

The light-emitting element 106 may be disposed on, for example, the first surface 110A of the housing 110. The light-emitting element 106 may provide, for example, state information of the electronic device 100 in a form of light. In an example embodiment, the light-emitting element 106 may provide, for example, a light source that is linked to an operation of the camera module 105. The light-emitting element 106 may include, for example, an LED, an IR LED, and a xenon lamp.

The connector holes 108 and 109 may include a first connector hole 108 for accommodating a connector (e.g., a universal serial bus (USB) connector) for transmitting and receiving power and/or data to and from an external electronic device, and/or a second connector hole 109 (e.g., an earphone jack) for accommodating a connector for transmitting and receiving an audio signal to and from an external electronic device.

Figure 3:
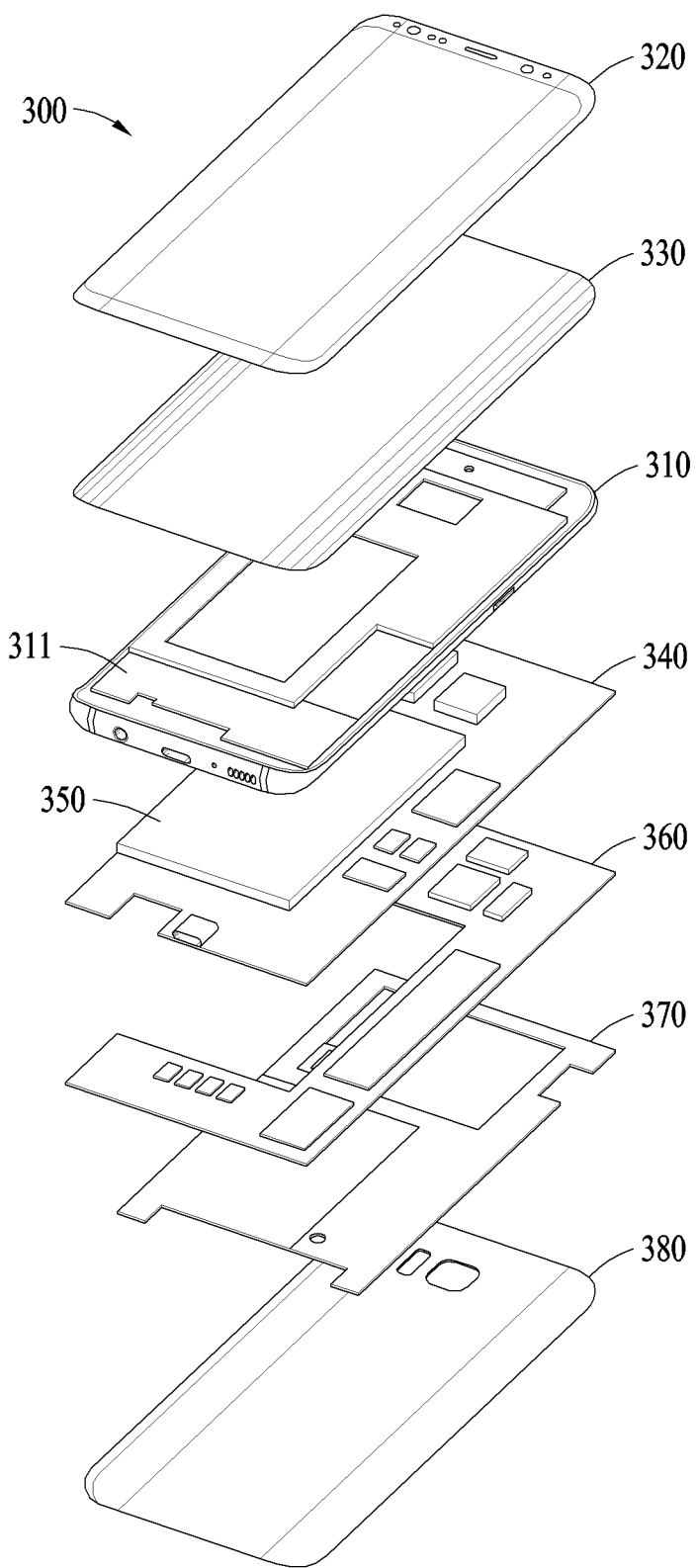
FIG. 3 is an exploded perspective view of the electronic device of FIG. 1.

FIG. 3 is an exploded perspective view of the electronic device of FIG. 1. Referring to FIG. 3, an electronic device 300 may include a side bezel structure 310, a first support member 311 (e.g., a bracket), a front plate 320, a display 330, a printed circuit board (PCB) 340, a battery 350, a second support member 360 (e.g., a rear case), an antenna 370, and a rear plate 380. In some example embodiments, the electronic device 300 may not include at least one (e.g., the first support member 311 or the second support member 360) of the components, or may additionally include other components. At least one of the components of the electronic device 300 may be the same as or similar to at least one of the components of the electronic device 100 of FIG. 1 or 2, and a repeated description thereof will be omitted hereinafter.

The first support member 311 may be disposed inside the electronic device 300 and connected to the side bezel structure 310, or may be formed integrally with the side bezel structure 310. The first support member 311 may be formed of, for example, a metal material and/or anon-metal material (e.g., polymer). The display 330 may be connected to one surface of the first support member 311, and the PCB 340 may be connected to another surface of the first support member 311. A processor, a memory, and/or an interface may be mounted on the PCB 340. The processor may include, for example, one or more of a central processing unit, an application processor, a graphics processing unit, an image signal processor, a sensor hub processor, and a communication processor.

The memory may include, for example, a volatile memory or a non-volatile memory.

The interface may include, for example, a high-definition multimedia interface (HDMI), a USB interface, a secure digital (SD) card interface, or an audio interface. For example, the interface may electrically or physically connect the electronic device 300 to an external electronic device, and may include a USB connector, an SD card/multimedia card (MMC) connector, or an audio connector.

The battery 350, which is a device for supplying power to at least one component of the electronic device 300, may include, for example, a primary cell that is not rechargeable, a secondary cell that is rechargeable, or a fuel cell. For example, at least a portion of the battery 350 may be disposed on substantially the same plane as the PCB 340. The battery 350 may be disposed integrally inside the electronic device 300, or disposed detachably from the electronic device 300.

The antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may perform short-range communication with an external device, or may wirelessly transmit and receive power required for charging to and from the external device. In an example embodiment, an antenna structure may be formed by a portion of the side bezel structure 310 and/or the first support member 311 or a combination thereof.

A film (e.g., a deco film) may be added to the surface of the housing to improve aesthetic appearance. However, it is important that the film be attached evenly to a corner or a curved surface in which several faces meet to avoid folding or wrinkling.

Figure 4:
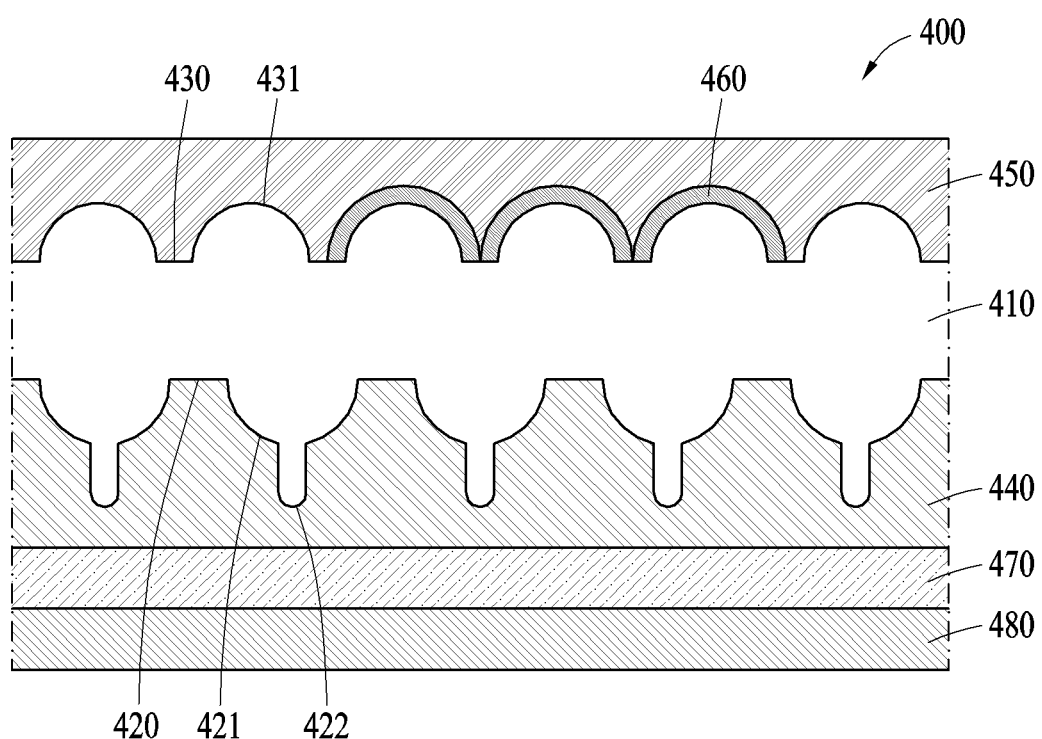
FIG. 4 is a cross-sectional view of an electronic device housing according to certain embodiments.

FIG. 4 is a cross-sectional view of an electronic device housing according to certain embodiments.

An electronic device housing 400 may have a rear plate (e.g., the rear plate 111 of FIG. 1, and the rear plate 380 of FIG. 3). When one surface of the electronic device housing 400 is referred to as a front surface, a surface opposite to the one surface may be referred to as a rear surface.

The terms "front surface" and "rear surface" of the electronic device housing 400 may be used to indicate one surface and the opposite surface of the electronic device housing 400, not a surface facing a predetermined direction of the electronic device housing 400.

The electronic device housing 400 may include a substrate 410, a deposition layer 440 formed on a front surface 420 of the substrate 410, and a transparent coating layer 450 formed on a rear surface 430 of the substrate 410. The front surface 420 of the substrate 410 may include a plurality of front surface protrusions 421 and a plurality of taper protrusions 422 protruding from the front protrusions 421, and the rear surface 430 may include a plurality of rear surface protrusions 431. According to certain embodiments, the deposition layer 440 may be formed to cover a substantially flat area (that is an area in which a protrusion is not formed), the front surface protrusions 421 and the taper protrusions 422 of the front surface 420. The transparent coating layer 450 may be formed to cover a substantially flat area (that is an area in which a protrusion is not formed) and the rear surface protrusions 431 of the rear surface 430.

A protrusion may be formed to protrude outwardly from an electronic device housing to have a convex shape, and may function as a convex lens by refracting light passing through the electronic device housing.

The transparent coating layer 450 may be formed to contact the outside to protect the electronic device housing 400 and the substrate 410, and may prevent the electronic device housing 400 from being corroding, contaminated, scratched, and/or worn away due to an external environment. According to certain embodiments, the transparent coating layer 450 may be a path through which light enters and exits from the electronic device housing 400. According to certain embodiments, a print layer 460 may be further formed between the transparent coating layer 450 and the rear surface 430. The print layer 460 may be formed to partially or completely cover the rear surface 430, and may be partially formed along the rear surface 430 based on a pattern, and/or a design the electronic device housing 400 intends to represent.

The deposition layer 440 may be formed on the front surface 420 of the substrate 410. According to certain embodiments, at least one of a paint layer 470 and a shielding layer 480 may be further formed on the deposition layer 440. In FIG. 4, the deposition layer 440 may be formed on the front surface 420 of the substrate 410, and the paint layer 470 and the shielding layer 480 may be sequentially formed on the deposition layer 440. According to certain embodiments, the deposition layer 440 may be formed to cover the substantially flat area, the front surface protrusions 421 and the taper protrusions 422 of the front surface 420. According to certain embodiments, either the paint layer 470 or the shielding layer 480 may be formed on the deposition layer 440, or both the paint layer 470 and the shielding layer 480 may be formed. The paint layer 470 and the shielding layer 480 may be formed in any order.

The deposition layer 440 formed on the front surface 420 of the substrate 410 of the electronic device housing 400 may include a metal component, for example, various metal materials, such as indium, titanium oxide, aluminum oxide, or silicon oxide, and may provide a sense of beauty by increasing a surface reflectance of the electronic device housing 400. According to certain embodiments, the paint layer 470 may be formed on the deposition layer 440. The paint layer 470, which is an opaque thin film layer, may provide a color or tint to the electronic device housing 400, and may allow a color of the deposition layer 440 to be tinted. The shielding layer 480 may be formed on the deposition layer 440 or the paint layer 470. The shielding layer 480 may perform a shielding function so that an inside of an electronic device (e.g., the electronic device 100 of FIG. 1, and the electronic device 300 of FIG. 3) is not visible. The shielding layer 480 may include various materials for shielding electromagnetic waves (e.g., electromagnetic interference (EMI) shielding).

At least one of the front surface protrusions 421, the taper protrusions 422, and the rear surface protrusions 431 may have a shape of at least one of a hemisphere, a hexahedron, a cylinder, and a triangular pyramid. A cross section of at least one of the front surface protrusions 421, the taper protrusions 422, and the rear surface protrusions 431 may have a shape of at least one of a circle, a triangle, a quadrangle, a pentagon, and a hexagon. The shape of at least one of the front surface protrusions 421, the taper protrusions 422, and the rear surface protrusions 431, or the shape of the cross section thereof may be determined based on a shape of a mold for manufacturing the electronic device housing 400, and may also be determined based on an intaglio pattern engraved in the mold by an engraving process.

At least one of the taper protrusions 422 may be formed from a central portion of the front surface protrusions 421. A central axis of at least one of the front surface protrusions 421 may be identical to or coincide with a central axis of at least one of the taper protrusions 422. At least one of the taper protrusions 422 may be formed to include a central axis of at least one of the front surface protrusions 421. At least one of the taper protrusions 422 may be formed to include a central axis of at least one of the front surface protrusions 421. At least one of the taper protrusions 422 may be formed to protrude further than the front surface protrusions 421. A central axis of at least one of fourth protrusions (e.g., fourth protrusions 932 of FIG. 9) that will be described below, may be identical to or coincide with a central axis of at least one of the rear surface protrusions 431, similarly to the front surface protrusions 421 and the taper protrusions 422.

A front surface protrusion 421 may have a width of 0.01 mm to 1 mm. A width of a taper protrusion 422 may be less than the width of the front surface protrusion 421. A rear surface protrusion 431 may have a width of 0.01 mm to 1 mm. The width of the rear surface protrusion 431 may be greater than the width of the front surface protrusion 421.

A depth of a front surface protrusion 421 and a depth of a taper protrusion 422 may be different from each other. The depth of the taper protrusion 422 may be greater than the depth of the front surface protrusion 421, and a difference between the depth of the front surface protrusion 421 and the depth of the taper protrusion 422 may be less than or equal to 10 µm. According to certain embodiments, the difference between the depth of the front surface protrusion 421 and the depth of the taper protrusion 422 may desirably be less than or equal to 8 µm.

The depth of the front surface protrusion 421 may range from 5 µm to 15 µm, and the depth of the taper protrusion 422 may range from 20 µm to 30 µm. The depth of the taper protrusion 422 may be greater than the depth of the front surface protrusion 421, and an image may be viewed in a magnified state due to interference and refraction of light passing through the front surface protrusion 421 and the taper protrusion 422. A rear surface protrusion 431 may have a depth of 5 µm to 15 µm.

According to certain embodiments, a ratio between a depth of a first protrusion 421 and a depth of a second protrusion 422 may range from 1:1.5 to 1:4. According to certain embodiments, the depth of the second protrusion 422 may be greater than the depth of the first protrusion 421, and an image may be viewed in a magnified state due to interference and refraction of light passing through the first protrusion 421 and the second protrusion 422. According to certain embodiments, a ratio between a depth of a third protrusion 431 and a depth of a fourth protrusion (e.g., a fourth protrusion 932 of FIG. 9) that will be described below may range from 1:1.5 to 1:4, similarly to the first protrusion 421 and the second protrusion 422.

According to certain embodiments, a pitch of a first protrusion 421 may be an integer multiple of a pitch of a second protrusion 422. According to certain embodiments, the pitch of the taper protrusions 422 may be an integer multiple of the pitch of the front surface protrusions 421. According to certain embodiments, each protrusion may be formed so that a central axis of at least one of the front surface protrusions 421 may coincide with a central axis of at least one of the taper protrusions 422. Since pitches of the front surface protrusions 421 and pitches of the taper protrusions 422 have an integer multiple relationship with each other, all the front surface protrusions 421 may be formed to overlap the taper protrusions 422, or all the taper protrusions 422 may be formed to overlap the front surface protrusions 421.

The electronic device housing 400 may have a transmittance of 50% or greater and a haze value of 30% or less. If the transmittance of the electronic device housing 400 increases and if the haze value decreases, an amount of light passing through the electronic device housing 400 may increase, which may facilitate realizing a visual surface texture by spectroscopy.

The substrate 410 of the electronic device housing 400 may be formed of a polymer, for example, a styrene-acrylonitrile (SAN), polymethyl methacrylate (PMMA), polycarbonate (PC), acrylonitrile butadiene styrene (ABS), polybutylene terephthalate (PBT), polyethylene terephthalate (PET), or polyoxymethylene (POM). The electronic device housing 400 may be transparent or substantially transparent, and may include a translucent material, and light may pass through the transparent coating layer 450 of the electronic device housing 400.

Due to interference and refraction of light passing through and/or reflected by the electronic device housing 400, an image may be viewed in a magnified state through the electronic device housing 400. In particular, a pattern shape with a sense of perspective by overlapping of the front surface protrusions 421, the taper protrusions 422, and/or the rear surface protrusions 431 may be exhibited. The electronic device housing 400 may perform a function of a convex lens due to overlapping of the rear surface protrusions 431.

The substrate 410 of the electronic device housing 400 may be formed by injection, and the substrate 410 may include at least one polymer among styrene-acrylonitrile (SAN), polymethyl methacrylate (PMMA), polycarbonate (PC), acrylonitrile butadiene styrene (ABS), polybutylene terephthalate (PBT), polyethylene terephthalate (PET), and polyoxymethylene (POM). The electronic device housing 400 may be formed through ultraviolet (UV) molding. For example, a substrate including the front surface protrusions 421, the taper protrusions 422 and the rear surface protrusions 431, and an electronic device housing may be manufactured by a scheme of injecting a UV curable resin into a mold with a pattern, placing a polymer resin on the mold, pressing the polymer resin, irradiating UV rays, and performing UV-curing.

The substrate 410 may have a curved surface and may be injection molded through a mold. For example, a substrate injection molded through a mold with a curved surface may include a curved surface. It shall be understood that objects formed by injection molding have structure that is the inverse of the mold to a higher degree than objects that are formed by adding parts. A plurality of protrusions may also be formed on the curved surface of the substrate 410 of the electronic device housing 400.

Hereinafter, a structure of a substrate according to certain embodiments will be described in more detail.

Figure 5:
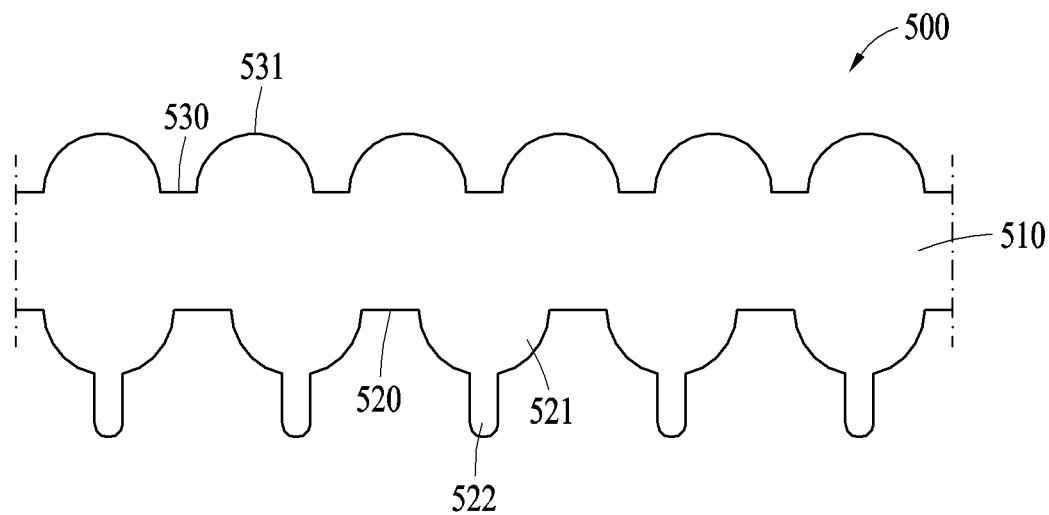
FIG. 5 is a cross-sectional view of a substrate of an electronic device housing according to certain embodiments.

FIG. 5 is a cross-sectional view of a substrate of an electronic device housing according to certain embodiments.

According to certain embodiments, a front surface 520 (e.g., the front surface 420 of FIG. 4) of a substrate 510 (e.g., the substrate 410 of FIG. 4) may include a front surface protrusion 521 (e.g., the front surface protrusion 421 of FIG. 4), and a taper protrusion 522 (e.g., the taper protrusion 422 of FIG. 4). A plurality of front surface protrusions 521 and/or a plurality of taper protrusions 522 may be formed.

According to certain embodiments, the plurality of front surface protrusions 521 front surface protrusions 521 and the plurality of taper protrusions 522 may each have a width, a depth, and a pitch. A depth of each of the front surface protrusion 521 and the taper protrusion 522 may be measured based on an imaginary area or surface extending from an area of the front surface 520 that is flat or in which the front surface protrusion 521 and/or the taper protrusion 522 are not formed. A width of each of the front surface protrusion 521 and the taper protrusion 522 may be measured based on an imaginary line or surface extending from the area of the front surface 520 in which the front surface protrusion 521 and/or the taper protrusion 522 are not formed. A pitch of each of the front surface protrusion 521 and the taper protrusion 522 may refer to a minimum distance between protrusions. Here, a width, a depth, and a pitch of protrusions may refer to an average width, an average depth, and an average pitch, respectively.

The front surface protrusion 521 and the taper protrusion 522 may overlap each other. The front surface protrusion and the taper protrusion may partially overlap, or may not overlap at all. In FIG. 5, the front surface protrusion 521 and the taper protrusion 522 may be formed to fully overlap each other.

According to certain embodiments, one of the front surface protrusions 521 may be different from the other front surface protrusions 521, or one of taper protrusions 522 may be different from the other taper protrusions 522 in at least one of a width, a depth, and a pitch. In FIG. 5, the front surface protrusion 521 and the taper protrusion 522 may have the same pitch and different widths and depths.

A rear surface 530 of the substrate 510 may include a rear surface protrusion 531. According to certain embodiments, a plurality of rear surface protrusions 531 may be formed. The front surface protrusion 521, the taper protrusion 522, and the rear surface protrusion 531 may be formed to protrude from the substrate 510 and may have different shapes. According to certain embodiments, two protrusions among the front surface protrusions 521, the taper protrusions 522, and the rear surface protrusions 531 may be different from each of the remaining ones of the front surface protrusions 521, taper protrusions 522, and rear surface protrusions 531 in at least one of a width, a depth, and a pitch.

That is, if one of the two protrusions is a front surface protrusion 521, the front surface protrusion is different in at least one of a width, a depth, and a pitch from each one of the remaining front surface protrusions 521. If one of the two protrusions is a taper protrusion 522, the taper protrusion 522 is different in at least one of a width, a depth, and a pitch from each one of the remaining taper protrusions 522. If one of the two protrusions is a rear surface protrusion 531, the rear surface protrusion 531 is different in at least one of a width, a depth, and a pitch from each one of the remaining rear surface protrusions 531. In In this context, it shall be understood that different shall be understood to mean any one of substantially different, a deviation that is in excess of manufacturing deviations that are commonly encountered when equal is intended, or a difference may be in excess of 3%.

A depth of the rear surface protrusion 531 may be measured based on an area of the rear surface 530 in which the rear surface protrusion 531 is not formed. A width of the third protrusion 531 may be measured based on an imaginary line or surface extending from the area of the rear surface 530 in which the third protrusion 531 is not formed. A pitch of the third protrusions 531 may refer to a minimum distance between protrusions.

Figure 6:
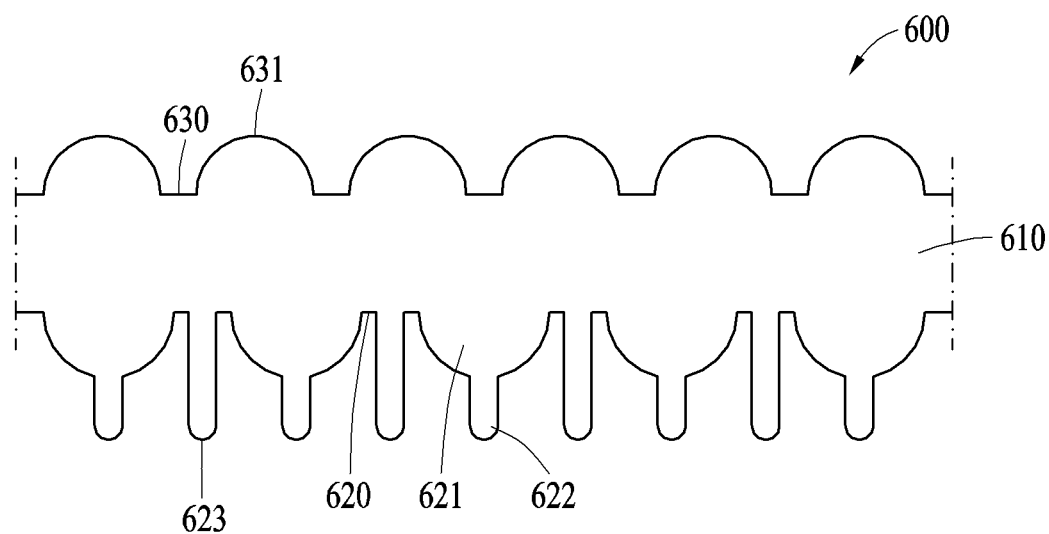
FIG. 6 is a cross-sectional view of a substrate of an electronic device housing according to certain embodiments.

FIG. 6 is a cross-sectional view of a substrate of an electronic device housing according to certain embodiments.

A front surface 620 of a substrate 610 (e.g., the substrate 410 of FIG. 4) of an electronic device housing 600 (e.g., the electronic device housing 400 of FIG. 4) may include a plurality of front surface protrusions 621 (e.g., the front surface protrusions 421 of FIG. 4) a plurality of taper protrusion 622 (e.g., the taper protrusions 422 of FIG. 4) and a plurality of second front surface protrusions 623, and a rear surface 630 of the substrate 610 may include a plurality of rear surface protrusions 631 (e.g., the rear surface protrusions 431 of FIG. 4). Two protrusions selected from the front surface protrusions 621, the taper protrusion 622, and the rear surface protrusions 631 may be different from each of the remaining ones of the front surface protrusions 621, taper protrusions 622, and rear surface protrusions 631 in at least one of a width, a depth, and a pitch. A width, a depth, and a pitch of protrusions may be determined according to criteria, as described above. Here, the width, the depth, and the pitch of the protrusions may refer to an average width, an average depth, and an average pitch, respectively.

Referring to FIG. 6, the front surface protrusions 621, the taper protrusion 622, and the second front surface protrusions 623 included in the front surface 620 of the substrate 610 may be different in all a width, a depth, and a pitch. More specifically, a pitch of a taper protrusion 622 may be less than or equal to half of a pitch of a front surface protrusion 621. According to certain embodiments, the pitch of the second front surface protrusions 623 may be less than the pitch of the first protrusion 621, and the second front surface protrusions 623 may be formed so as not to overlap the first protrusion 621.

Figure 7:
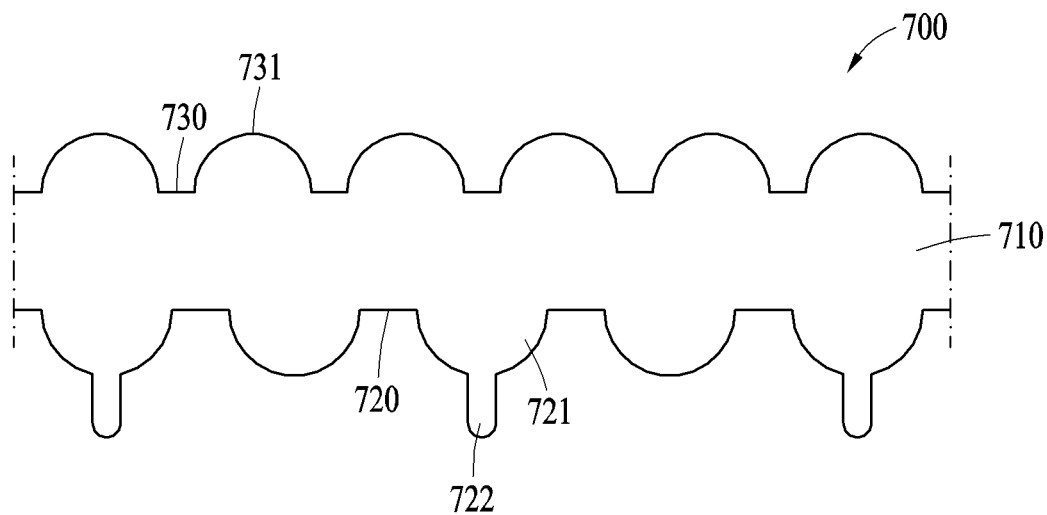
FIG. 7 is a cross-sectional view of a substrate of an electronic device housing according to certain embodiments.

FIG. 7 is a cross-sectional view of a substrate of an electronic device housing according to certain embodiments.

A front surface 720 (e.g., the front surface 420 of FIG. 4) of a substrate 710 (e.g., the substrate 410 of FIG. 4) of an electronic device housing 700 (e.g., the electronic device housing 400 of FIG. 4) may include a plurality of front surface protrusions 721 (e.g., the front surface protrusions 421 of FIG. 4) and a plurality of taper protrusions 722 (e.g., the taper protrusions 422 of FIG. 4), and a rear surface 730 (e.g., the rear surface 430 of FIG. 4) of the substrate 710 may include a plurality of rear surface protrusions 731 (e.g., the rear surface protrusions 431 of FIG. 4). Two protrusions selected from the front surface protrusions 721, the taper protrusions 722, and the rear surface protrusions 731 may be different from each of the remaining front surface protrusions 721, the taper protrusions 722, and the rear surface protrusions 731 in at least one of a width, a depth, and a pitch. A width, a depth, and a pitch of protrusions may be determined according to criteria, as described above. Here, the width, the depth, and the pitch of the protrusions may refer to an average width, an average depth, and an average pitch, respectively.

Referring to FIG. 7, the front surface protrusions 721 and the taper protrusions 722 included in the front surface 720 of the substrate 710 may be different in all a width, a depth, and a pitch. More specifically, a pitch of a taper protrusion 722 may be greater than or equal to half of a pitch of a front surface protrusion 721. The pitch of the taper protrusion 722 may be greater than the pitch of the front surface protrusion 721, and the front surface protrusion 721 may be formed so as not to overlap the taper protrusion 722.

Figure 8:
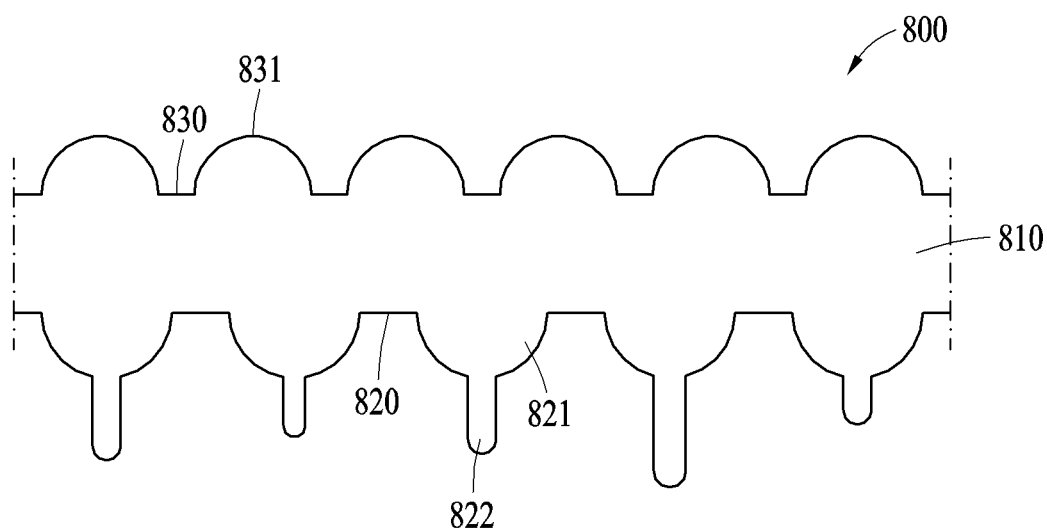
FIG. 8 is a cross-sectional view of a substrate of an electronic device housing according to certain embodiments.

FIG. 8 is a cross-sectional view of a substrate of an electronic device housing according to certain embodiments.

A front surface 820 (e.g., the front surface 420 of FIG. 4) of a substrate 810 (e.g., the substrate 410 of FIG. 4) of an electronic device housing 800 (e.g., the electronic device housing 400 of FIG. 4) may include a plurality of front surface protrusions 821 (e.g., the front surface protrusions 421 of FIG. 4) and a plurality of taper protrusions 822 (e.g., the taper protrusions 422 of FIG. 4), and a rear surface 830 (e.g., the rear surface 430 of FIG. 4) of the substrate 810 may include a plurality of rear surface protrusions 831 (e.g., the rear surface protrusions 431 of FIG. 4). According to certain embodiments, the plurality of taper protrusions 822 may be different from each other in a depth and/or width. Here, a width and a depth of protrusions may refer an average width and an average depth, respectively.

Figure 9:
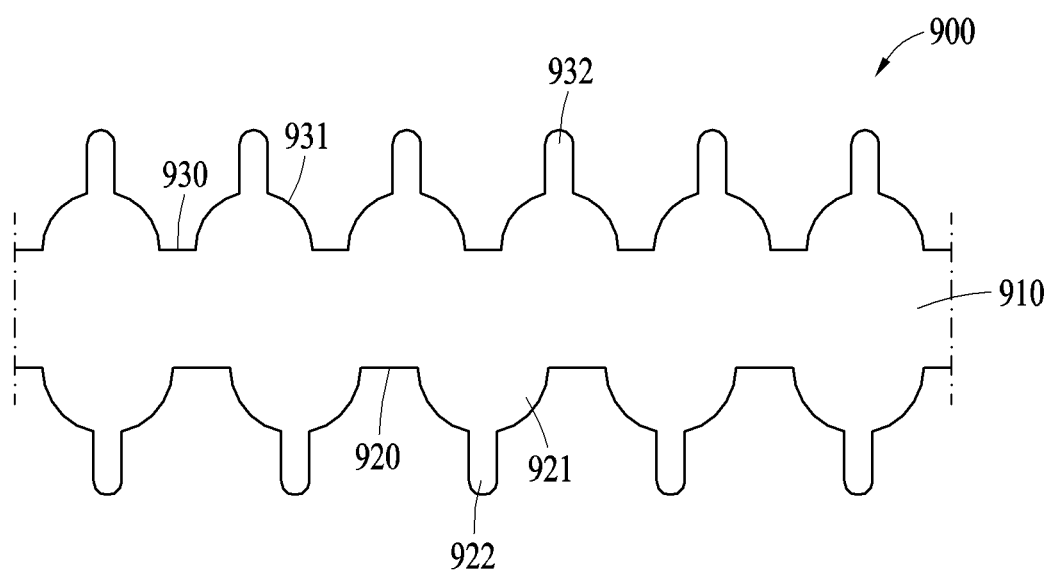
FIG. 9 is a cross-sectional view of a substrate of an electronic device housing according to certain embodiments.

FIG. 9 is a cross-sectional view of a substrate of an electronic device housing according to certain embodiments.

According to certain embodiments, a rear surface 930 (e.g., the rear surface 430 of FIG. 4) of a substrate 910 (e.g., the substrate 410 of FIG. 4) of an electronic device housing 900 (e.g., the electronic device housing 400 of FIG. 4) may further include another plurality of taper protrusions 932 protruding from the rear surface protrusions 932. The taper protrusions 932 protruding from the rear surface protrusions 931 may fully or partially overlap rear surface protrusions 931 (e.g., the rear surface protrusions 431 of FIG. 4), or may not completely overlap the third protrusions 931. A rear surface protrusion 931 and a taper protrusion 932 may be different from each other in at least one of a width, a depth, and a pitch. According to certain embodiments, two protrusions selected from front surface protrusions 921 (e.g., the front surface protrusions 421 of FIG. 4), taper protrusions 922 protruding from the front surface protrusions 921 (e.g., the taper protrusions 422 of FIG. 4), the rear surface protrusions 931 and the taper protrusions 932 protruding from the rear surface protrusions 931 may be different from each other in at least one of a width, a depth, and a pitch. Here, a width, a depth, and a pitch of protrusions may refer to an average width, an average depth, and an average pitch, respectively.

According to certain embodiments, a width of a taper protrusion 932 (e.g., a fourth protrusion 932 of FIG. 9) may be less than the width of the rear surface protrusion 931, similarly to the front surface protrusion 921 and the taper protrusion 922. A depth of a rear surface protrusion 931 and a depth of a taper protrusion 932 may be different from each other, and a difference between the depth of the rear surface protrusion 931 and the depth of the taper protrusion 932 may be less than or equal to 10 μm, similarly to the front surface protrusion 921 and the taper protrusion 922. According to certain embodiments, a taper protrusion 932 may have a depth of 20 μm to 30 μm, similarly to the taper protrusion 922. A pitch of a rear surface protrusion 931 may be an integer multiple of a pitch of a taper protrusion 932, similarly to the front surface protrusion 921 and the taper protrusion 922.

A taper protrusion 932 may have a shape of at least one of a hemisphere, a hexahedron, a cylinder, and a triangular pyramid. According to certain embodiments, a cross section of the taper protrusions 932 may have a shape of at least one of a circle, a triangle, a quadrangle, a pentagon, and a hexagon. According to certain embodiments, the shape of the taper protrusion 932, or the shape of the cross section thereof may be determined based on a shape of a mold for manufacturing the electronic device housing 900, and may also be determined based on an intaglio pattern engraved in the mold by an engraving process.

At least one of the taper protrusions 932 may be formed from a central portion of the third protrusions 931. According to certain embodiments, a central axis of at least one of the third protrusions 931 may be identical to or coincide with a central axis of at least one of the taper protrusions 932. According to certain embodiments, at least one of the taper protrusions 932 may be formed to include a central axis of at least one of the third protrusions 931. According to certain embodiments, at least one of the taper protrusions 932 may be formed to include a central axis of at least one of the third protrusions 931. At least one of the taper protrusions 932 may be formed to protrude further than the third protrusions 931.

A rear surface protrusion 931 may have a width of 0.01 mm to 1 mm. According to certain embodiments, a width of a taper protrusion 932 may be less than the width of the rear surface protrusion 931.

A depth of a rear surface protrusion 931 and a depth of a taper protrusion 932 may be different from each other. According to certain embodiments, the depth of the taper protrusion 932 may be greater than the depth of the rear surface protrusion 931, and a difference between the depth of the rear surface protrusion 931 and the depth of the taper protrusion 932 may be less than or equal to 10 μm. The difference between the depth of the taper protrusion 931 and the depth of the taper protrusion 932 may desirably be greater than 0 μm and less than or equal to 8 μm.

A rear surface protrusion 931 may have a depth of 5 μm to 15 μm, and a taper protrusion 932 may have a depth of 20 μm to 30 μm. According to certain embodiments, the depth of the taper protrusion 932 may be greater than the depth of the rear surface protrusion 931, and an image may be viewed in a magnified state due to interference and refraction of light passing through the rear surface protrusion 931 and the taper protrusion 932.

A ratio between a depth of a rear surface protrusion 931 and a depth of a taper protrusion 932 may range from 1:1.5 to 1:4. According to certain embodiments, the depth of the taper protrusion 932 may be greater than the depth of the rear surface protrusion 931, and an image may be viewed in a magnified state due to interference and refraction of light passing through the third protrusion 931 and the taper protrusion 932.

A pitch of a rear surface protrusion 931 may be an integer multiple of a pitch of a taper protrusion 932. The pitch of the taper protrusion 932 may be an integer multiple of the pitch of the rear surface protrusion 931. Each protrusion may be formed so that a central axis of at least one of the rear surface protrusions 931 may coincide with a central axis of at least one of the taper protrusions 932. Since pitches of the rear surface protrusions 931 and pitches of the taper protrusions 932 have an integer multiple relationship with each other, all the rear surface protrusions 931 may be formed to overlap the taper protrusions 932, or all the taper protrusions 932 may be formed to overlap the rear surface protrusions 931.

According to certain embodiments, an electronic device housing (e.g., the electronic device housing 400 of FIG. 4) may include a substrate (e.g., the substrate 410 of FIG. 4) including a front surface (e.g., the front surface 420 of FIG. 4) comprising a plurality of front surface protrusions (e.g., the front surface protrusions 421 of FIG. 4) and a plurality of taper protrusions (e.g., the taper protrusions 422 of FIG. 4) protruding from the plurality of front surface protrusions, and a rear surface (e.g., the rear surface 430 of FIG. 4) comprising a plurality of rear surface protrusions (e.g., the rear surface protrusions 431 of FIG. 4), wherein two protrusions selected from the plurality of front surface protrusions, the plurality of taper protrusions, and the plurality of rear surface protrusions are different from each remaining ones of the plurality of front surface protrusions, the plurality of taper protrusions, and the plurality of rear surface protrusions. Two protrusions selected from the first protrusions, the second protrusions, and the third protrusions may be different from each other in at least one of a width, a depth, and a pitch, a deposition layer (e.g., the deposition layer 440 of FIG. 4) formed on a front surface (e.g., the front surface 420 of FIG. 4) of the substrate, and a transparent coating layer (e.g., the transparent coating layer 450 of FIG. 4) formed on a rear surface (e.g., the rear surface 430 of FIG. 4) of the substrate.

According to certain embodiments, at least one of the plurality of front surface protrusions (e.g., the plurality of front surface protrusions 421 of FIG. 4), plurality of taper protrusions (e.g., the plurality of taper protrusion 422 of FIG. 4) protruding from the plurality of front surface protrusions, and the plurality of rear surface protrusion (e.g., the plurality of rear surface protrusions 431 of FIG. 4) may have a shape of at least one of a hemisphere, a hexahedron, a cylinder, and a triangular pyramid.

According to certain embodiments, a central axis of at least one of the plurality of front surface protrusions (e.g., the front surface protrusions 421 of FIG. 4) may be identical to a central axis of at least one of the plurality of taper protrusions (e.g., the taper protrusions 422 of FIG. 4).

According to certain embodiments, a difference between a depth of plurality of front surface protrusions (e.g., the first protrusion 421 of FIG. 4) and a depth of the plurality of taper protrusions(e.g., the second protrusion 422 of FIG. 4) may be less than or equal to 10 μm.

According to certain embodiments, the plurality of front surface protrusions (e.g., the first protrusion 421 of FIG. 4) may have a depth of 5 μm to 15 μm, and the plurality of taper protrusions (e.g., the taper protrusion 422 of FIG. 4) may have a depth of 20 μm to 30 μm.

According to certain embodiments, a ratio between the depth of the plurality of front surface protrusions (e.g., the plurality of front surface protrusions 421 of FIG. 4) and the depth of the plurality of taper protrusions (e.g., the plurality of front surface protrusions 422 of FIG. 4) may range from 1:1.5 to 1:4.

According to certain embodiments, a pitch of the plurality of front surface protrusions (e.g., the plurality of front surface protrusions 421 of FIG. 4) may be an integer multiple of a pitch of the plurality of taper protrusions (e.g., the plurality of taper protrusions 422 of FIG. 4).

According to certain embodiments, the rear surface (e.g., the rear surface 930 of FIG. 9) may further include a plurality of taper protrusions (e.g., the taper protrusions 932 of FIG. 9) protruding from the rear surface protrusions, and the plurality of rear surface protrusions (e.g., the rear surface protrusions 931 of FIG. 9) and the plurality of taper protrusions (e.g., the taper protrusions 932 of FIG. 9) protruding from the plurality of rear surface protrusions may be different from each other in at least one of a width, a depth, and a pitch.

According to certain embodiments, the housing (e.g., the electronic device housing 400 of FIG. 4) may have a transmittance of 50% or greater and a haze value of 30% or less.

According to certain embodiments, the electronic device housing may further include at least one of a paint layer (e.g., the paint layer 470 of FIG. 4) and a shielding layer (e.g., the shielding layer 480 of FIG. 4) formed on the deposition layer (the deposition layer 440 of FIG. 4).

According to certain embodiments, the substrate (e.g., the substrate 410 of FIG. 4) may include at least one of SAN, PMMA, PC, ABS, PBT, PET, and POM.

Figure 10:
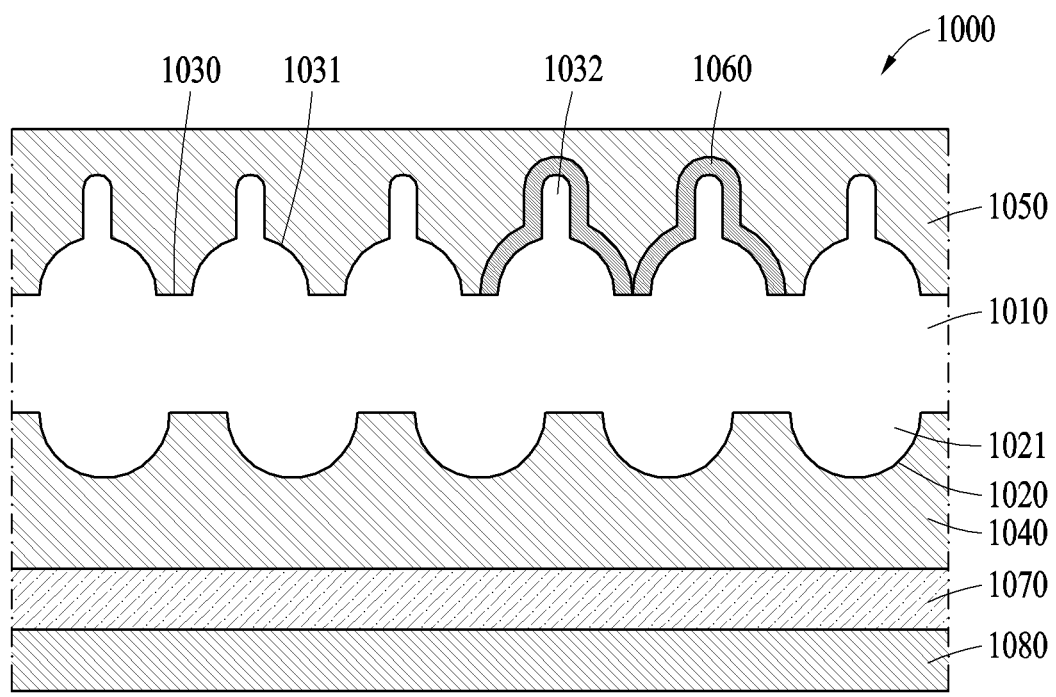
FIG. 10 is a cross-sectional view of an electronic device housing according to certain embodiments.

FIG. 10 is a cross-sectional view of an electronic device housing according to certain embodiments.

According to certain embodiments, an electronic device housing 1000 may be applied to a rear plate (e.g., the rear plate 111 of FIG. 1, and the rear plate 380 of FIG. 3) of an electronic device (e.g., the electronic device 100 of FIG. 1, and the electronic device 300 of FIG. 3). According to certain embodiments, when one surface of the electronic device housing 1000 is referred to as a front surface, a surface opposite to the one surface may be referred to as a rear surface.

According to certain embodiments, the terms "front surface" and "rear surface" of the electronic device housing 1000 may be used to indicate one surface and the opposite surface of the electronic device housing 1000, not a surface facing a predetermined direction of the electronic device housing 1000.

According to certain embodiments, the electronic device housing 1000 may include a substrate 1010 including a front surface 1020 comprising a plurality of front surface protrusions 1021 and a plurality of taper protrusions 1032 protruding from the plurality of front surface protrusions, and a rear surface 1030 comprising a plurality of rear surface protrusions 1031, a deposition layer 1040 formed on the front surface 1020 of the substrate 1010, and a transparent coating layer 1050 formed on the rear surface 1030 of the substrate 1010. According to certain embodiments, the deposition layer 1040 may be formed to cover a substantially flat area (that is an area in which a protrusion is not formed) and the front surface protrusions 1021 of the front surface 1020. The transparent coating layer 1050 may be formed to cover a substantially flat area (that is an area in which a protrusion is not formed), the rear surface protrusions 1031, and the taper protrusions 1032 of the rear surface 1030.

According to certain embodiments, a protrusion may be formed to protrude outwardly from an electronic device housing to have a convex shape, and may function as a convex lens by refracting light passing through the electronic device housing.

According to certain embodiments, the transparent coating layer 1050 may be formed to contact the outside to protect the electronic device housing 1000 and the substrate 1010, and may prevent the electronic device housing 1000 from being corroding, contaminated, scratched, and/or worn away due to an external environment. According to certain embodiments, the transparent coating layer 1050 may be a path through which light enters and exits from the electronic device housing 1000. According to certain embodiments, a print layer 1060 may be further formed between the transparent coating layer 1050 and the rear surface 1030. The print layer 1060 may be formed to partially or completely cover the rear surface 1030, and may be partially formed along the rear surface 1030 based on a pattern, and/or a design the electronic device housing 1000 intends to represent.

According to certain embodiments, the deposition layer 1040 may be formed on the front surface 1020 of the substrate 1010. According to certain embodiments, at least one of a paint layer 1070 and a shielding layer 1080 may be further formed on the deposition layer 1040. In FIG. 10, the deposition layer 1040 may be formed on the front surface 1020 of the substrate 1010, and the paint layer 1070 and the shielding layer 1080 may be sequentially formed on the deposition layer 1040. According to certain embodiments, the deposition layer 1040 may be formed to cover the substantially flat area and the front surface protrusions 1021 of the front surface 1020. According to certain embodiments, either the paint layer 1070 or the shielding layer 1080 may be formed on the deposition layer 1040, or both the paint layer 1070 and the shielding layer 1080 may be formed. The paint layer 1070 and the order of formation of the shielding layer 1080 may be formed regardless of order.

According to certain embodiments, the deposition layer 1040 formed on the front surface 1020 of the substrate 1010 of the electronic device housing 1000 may include a metal component, for example, various metal materials, such as indium, titanium oxide, aluminum oxide, or silicon oxide, and may provide a sense of beauty by increasing a surface reflectance of the electronic device housing 1000. According to certain embodiments, the paint layer 1070 may be formed on the deposition layer 1040. The paint layer 1070, which is an opaque thin film layer, may implement a color in the electronic device housing 1000, and may allow a color of the deposition layer 1040 to be shown darker. According to certain embodiments, the shielding layer 1080 may be formed on the deposition layer 1040 or the paint layer 1070 and may perform a shielding function so that an inside of an electronic device (e.g., the electronic device 100 of FIG. 1, and the electronic device 300 of FIG. 3) is not visible. According to certain embodiments, the shielding layer 1080 may include various materials for shielding electromagnetic waves (e.g., EMI shielding).

According to certain embodiments, at least one of the front surface protrusions 1021, the rear surface protrusions 1031, and the taper protrusions 1032 may have a shape of at least one of a hemisphere, a hexahedron, a cylinder, and a triangular pyramid. According to certain embodiments, a cross section of at least one of the front surface protrusions 1021, the rear surface protrusions 1031 and the taper protrusions 1032 may have a shape of at least one of a circle, a triangle, a quadrangle, a pentagon, and a hexagon. According to certain embodiments, the shape of at least one of the front surface protrusions 1021, the rear surface protrusions 1031, and the taper protrusions 1032, or the shape of the cross section thereof may be determined based on a shape of a mold for manufacturing the electronic device housing 1000, and may also be determined based on an intaglio pattern engraved in the mold by an engraving process.

According to certain embodiments, at least one of the taper protrusions 1032 may be formed from a central portion of the rear surface protrusions 1031. According to certain embodiments, a central axis of at least one of the rear surface protrusions 1031 may be identical to or coincide with a central axis of at least one of the taper protrusions 1032. According to certain embodiments, at least one of the taper protrusions 1032 may be formed to include a central axis of at least one of the rear surface protrusions 1031. According to certain embodiments, at least one of the taper protrusions 1032 may be formed to include a central axis of at least one of the rear surface protrusions 1031. At least one of the taper protrusions 1032 may be formed to protrude further than the rear surface protrusions 1031.

According to certain embodiments, a rear surface protrusion 1031 may have a width of 0.01 mm to 1 mm. According to certain embodiments, a width of a taper protrusion 1032 may be less than the width of the rear surface protrusion 1031. According to certain embodiments, a front surface protrusion 1021 may have a width of 0.01 mm to 1 mm. According to certain embodiments, the width of the front surface protrusion 1021 may be less than the width of the rear surface protrusion 1031.

According to certain embodiments, a depth of a rear surface protrusion 1031 and a depth of a taper protrusion 1032 may be different from each other. According to certain embodiments, the depth of the taper protrusion 1032 may be greater than the depth of the rear surface protrusion 1031, and a difference between the depth of the rear surface protrusion 1031 and the depth of the taper protrusion 1032 may be less than or equal to 10 µm. According to certain embodiments, the difference between the depth of the rear surface protrusion 1031 and the depth of the taper protrusion 1032 may desirably be greater than 0 µm and less than or equal to 8 µm.

According to certain embodiments, a rear surface protrusion 1031 may have a depth of 5 µm to 15 µm, and a taper protrusion 1032 may have a depth of 20 µm to 30 µm. According to certain embodiments, the depth of the taper protrusion 1032 may be greater than the depth of the rear surface protrusion 1031, and an image may be viewed in a magnified state due to interference and refraction of light passing through the rear surface protrusion 1031 and the taper protrusion 1032.

According to certain embodiments, a ratio between the depth of the rear surface protrusion 1031 and the depth of the taper protrusion 1032 may be range from 1:1.5 to 1:4. According to certain embodiments, the depth of the taper protrusion 1032 may be greater than the depth of the rear surface protrusion 1031, and an image may be viewed in a magnified state due to interference and refraction of light passing through the rear surface protrusion 1031 and the taper protrusion 1032.

According to certain embodiments, a pitch of a rear surface protrusion 1031 may be an integer multiple of a pitch of a taper protrusion 1032. According to certain embodiments, the pitch of the taper protrusion 1032 may be an integer multiple of the pitch of the rear surface protrusion 1031. According to certain embodiments, each protrusion may be formed so that a central axis of at least one of the rear surface protrusions 1031 may coincide with a central axis of at least one of the taper protrusions 1032. Since pitches of the rear surface protrusions 1031 and pitches of the taper protrusions 1032 have an integer multiple relationship with each other, all the rear surface protrusions 1031 may be formed to overlap the taper protrusions 1032, or all the taper protrusions 1032 may be formed to overlap the rear surface protrusions 1031.

According to certain embodiments, the electronic device housing 1000 may have a transmittance of 50% or greater and a haze value of 30% or less. According to certain embodiments, if the transmittance of the electronic device housing 1000 increases and if the haze value decreases, an amount of light passing through the electronic device housing 1000 may increase, which may facilitate realizing a visual surface texture by spectroscopy.

According to certain embodiments, the substrate 1010 of the electronic device housing 1000 may be formed of a polymer, for example, a styrene-acrylonitrile (SAN), polymethyl methacrylate (PMMA), polycarbonate (PC), acrylonitrile butadiene styrene (ABS), polybutylene terephthalate (PBT), polyethylene terephthalate (PET), or polyoxymethylene (POM). According to certain embodiments, the electronic device housing 1000 may be transparent or substantially transparent, and may include a translucent material, and light may pass through the transparent coating layer 1050 of the electronic device housing 1000.

According to certain embodiments, due to interference and refraction of light passing through and/or reflected by the electronic device housing 1000, an image may be viewed in a magnified state through the electronic device housing 1000. In particular, due to overlapping of the front surface protrusions 1021, the rear surface protrusions 1031, and/or the fourth protrusions, a pattern shape having a sense of perspective may be exhibited.

According to certain embodiments, the substrate 1010 of the electronic device housing 1000 may be formed by injection, and the substrate 1010 may include at least one polymer among styrene-acrylonitrile (SAN), polymethyl methacrylate (PMMA), polycarbonate (PC), acrylonitrile butadiene styrene (ABS), polybutylene terephthalate (PBT), polyethylene terephthalate (PET), and polyoxymethylene (POM). According to certain embodiments, the electronic device housing 1000 may be formed through UV molding. For example, a substrate including the front surface protrusions 1021, the rear surface protrusions 1031 and the taper protrusions 1032, and an electronic device housing may be manufactured by a scheme of injecting a UV curable resin into a mold with a pattern, placing a polymer resin on the mold, pressing the polymer resin, irradiating UV rays, and performing UV-curing.

According to certain embodiments, the substrate 1010 may have a curved surface. According to certain embodiments, the substrate 1010 of the electronic device housing 1000 may be injection molded through a mold. For example, a substrate injection molded through a mold with a curved surface may include a curved surface. According to certain embodiments, a plurality of protrusions may also be formed on the curved surface of the substrate 1010 of the electronic device housing 1000.

According to certain embodiments, the rear surface protrusions 1031 and the taper protrusions 1032 may respectively correspond to the front surface protrusions 421 and the taper protrusions 422 of FIG. 4, and a relationship between the rear surface protrusions 1031 and the taper protrusions 1032 may be the same as or similar to a relationship between the front surface protrusions 421 and the taper protrusions 422 of FIG. 4.

According to certain embodiments, the plurality of rear surface protrusions 1031 and the plurality of taper protrusions 1032 may each have a width, a depth, and a pitch. According to certain embodiments, a depth of each of the rear surface protrusion 1031 and the taper protrusion 1032 may be measured based on an imaginary area or surface extending from an area of the rear surface 1030 in which the rear surface protrusion 1031 and/or the taper protrusion 1032 are not formed. According to certain embodiments, a width of each of the rear surface protrusion 1031 and the taper protrusion 1032 may be measured based on an imaginary line or surface extending from the area of the rear surface 1030 in which the rear surface protrusion 1031 and/or the taper protrusion 1032 are not formed. According to certain embodiments, a pitch of each of the rear surface protrusion 1031 and the taper protrusion 1032 may refer to a minimum distance between protrusions. Here, a width, a depth, and a pitch of protrusions may refer to an average width, an average depth, and an average pitch, respectively.

According to certain embodiments, the rear surface protrusion 1031 and the taper protrusion 1032 may overlap each other. According to an example embodiment, the third protrusion and the fourth protrusion may partially overlap, or may not overlap at all.

According to certain embodiments, the rear surface protrusion 1031 and the taper protrusion 1032 may be different in at least one of a width, a depth, and a pitch.

According to certain embodiments, the front surface protrusion 1021, the rear surface protrusion 1031, and the taper protrusion 1032 may be formed to protrude from the substrate 1010 and may have different shapes. According to certain embodiments, two protrusions selected from the front surface protrusions 1021, the rear surface protrusions 1031, and the taper protrusions 1032 may be different from each other in at least one of a width, a depth, and a pitch.

According to certain embodiments, the rear surface protrusions 1031 and the taper protrusions 1032 included in the rear surface 1030 of the substrate 1010 may be different in all a width, a depth, and a pitch. More specifically, a pitch of a rear surface protrusions 1031 may be less than or equal to half of a pitch of a taper protrusions 1032. According to certain embodiments, the pitch of the taper protrusion 1032 may be less than the pitch of the rear surface protrusion 1031, and the taper protrusion 1032 may be formed so as not to overlap the rear surface protrusion 1031.

According to certain embodiments, the rear surface protrusions 1031 and the taper protrusions 1032 included in the rear surface 1030 of the substrate 1010 may be different in all a width, a depth, and a pitch. More specifically, a pitch of a taper protrusions 1032 may be greater than or equal to half of a pitch of a rear surface protrusions 1031. According to certain embodiments, the pitch of the taper protrusion 1032 may be greater than the pitch of the rear surface protrusion 1031, and the rear surface protrusion 1031 that does not overlap the taper protrusion 1032 at all may be formed.

According to certain embodiments, an electronic device housing (e.g., the electronic device housing 1000 of FIG. 10) may include a substrate (e.g., the substrate 1010 of FIG. 10), a front surface (e.g., the front surface 1020 of FIG. 10) may comprise a plurality of front surface protrusions (e.g., the front surface protrusions 1021 of FIG. 10), and the rear surface (e.g., the rear surface 1030 of FIG. 10) may comprises a plurality of rear surface protrusions (e.g., the rear surface protrusions 1031 of FIG. 10), and a plurality of taper protrusions (e.g., the taper protrusions 1032 of FIG. 10) protruding from the rear surface protrusions. Two protrusions selected from the plurality of front surface protrusions, rear surface protrusions, and taper protrusions are different from each remaining one of the plurality of front surface protrusions, plurality of rear surface protrusions, and plurality of taper protrusions. The electronic device housing may also include a deposition layer (e.g., the deposition layer 1040 of FIG. 10) formed on the front surface (e.g., the front surface 1020 of FIG. 10) of the substrate, and a transparent coating layer (e.g., the transparent coating layer 1050 of FIG. 10) formed on the rear surface (e.g., the rear surface 1030 of FIG. 10) of the substrate.

According to certain embodiments, a central axis of at least one of the plurality of rear surface protrusions (e.g., the plurality of rear surface protrusion 1031 of FIG. 10) may be identical to a central axis of at least one of the plurality of taper protrusions (e.g., the plurality of taper protrusion 1032 of FIG. 10).

According to certain embodiments, a difference between a depth of a plurality of rear surface protrusions 1031 (e.g., the plurality of rear surface protrusions 1031 of FIG. 10) and a plurality of taper protrusions (e.g., the taper protrusion 1032 of FIG. 10) protruding from the plurality of rear surface protrusions may be less than or equal to 10 μm.

According to certain embodiments, a ratio between the depth of the plurality of rear surface protrusions 1031 (e.g., the rear surface protrusion 1031 of FIG. 10) and the depth of the plurality of taper protrusions (e.g., the taper protrusion 1032 of FIG. 10) may range from 1:1.5 to 1:4.

According to certain embodiments, a pitch of the plurality of rear surface protrusions (e.g., the plurality of rear surface protrusions 1031 of FIG. 10) may be an integer multiple of a pitch of the plurality of taper protrusions (e.g., the taper protrusion 1032 of FIG. 10).

According to certain embodiments, the electronic device housing may further include at least one of a paint layer (e.g., the paint layer 1070 of FIG. 10) and a shielding layer (e.g., the shielding layer 1080 of FIG. 10) formed on the deposition layer (e.g., the deposition layer 1040 of FIG. 10).

The electronic device according to certain embodiments may be enclosed by an electronic device housing. According to certain embodiments, the electronic device housing may be a front plate (e.g., the front plate 102 of FIG. 1) or a rear plate (e.g., the rear plate 111 of FIG. 2) of the electronic device. The electronic device enclosed by the electronic device housing may refer to an electronic device including an electronic device housing on at least one surface thereof.

According to certain embodiments, an electronic device housing (e.g., the electronic device housing 400 of FIG. 4) enclosing an electronic device may include a substrate (e.g., the substrate 410 of FIG. 4), the substrate may include a front surface comprising a plurality of front surface protrusions (e.g., the plurality of front surface protrusions 421 of FIG. 4) and a plurality of taper projections (e.g., the plurality of taper protrusions 422 of FIG. 4), and a rear surface comprising a plurality of rear surface protrusions (e.g., the rear surface protrusions 431 of FIG. 4). Two protrusions selected from the plurality of front surface protrusions, the plurality of taper protrusions, and the plurality of rear surface protrusions may be different from each remaining one of the plurality of front surface protrusions, the plurality of taper protrusions, and the plurality of rear surface protrusions, in at least one of a width, a depth, and a pitch. The electronic device housing may further include a deposition layer (e.g., the deposition layer 440 of FIG. 4) formed on a front surface (e.g., the front surface 420 of FIG. 4) of the substrate, and a transparent coating layer (e.g., the transparent coating layer 450 of FIG. 4) formed on a rear surface (e.g., the rear surface 430 of FIG. 4) of the substrate.

According to certain embodiments, the rear surface of the electronic device housing enclosing the electronic device may further include a plurality of taper protrusions protruding from the plurality of rear surface protrusions.

According to certain embodiments, a pattern formed by refraction and interference of light between the plurality of front surface protrusions, the plurality of taper protrusions, and the plurality of rear surface protrusions is shown on a surface of the electronic device housing.

Figure 11C:
FIGS. 11A through 11C illustrate actual images of an electronic device to which an electronic device housing is applied, according to certain embodiments.
Figure 11B:
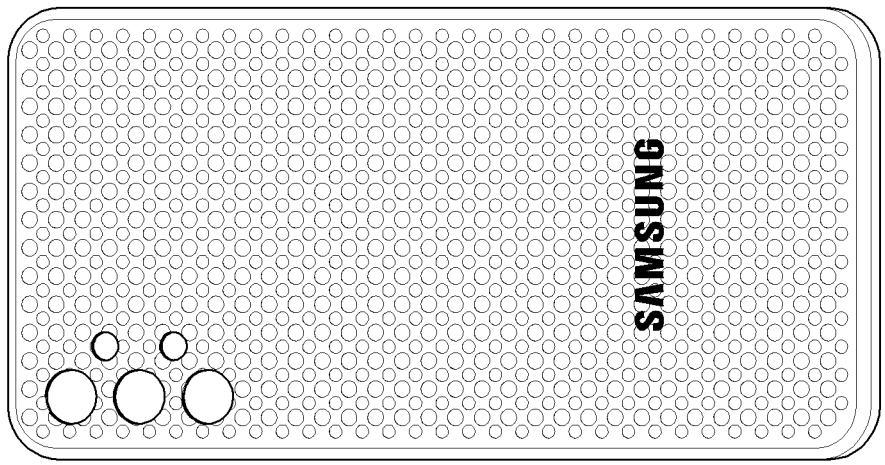
Figure 11A:
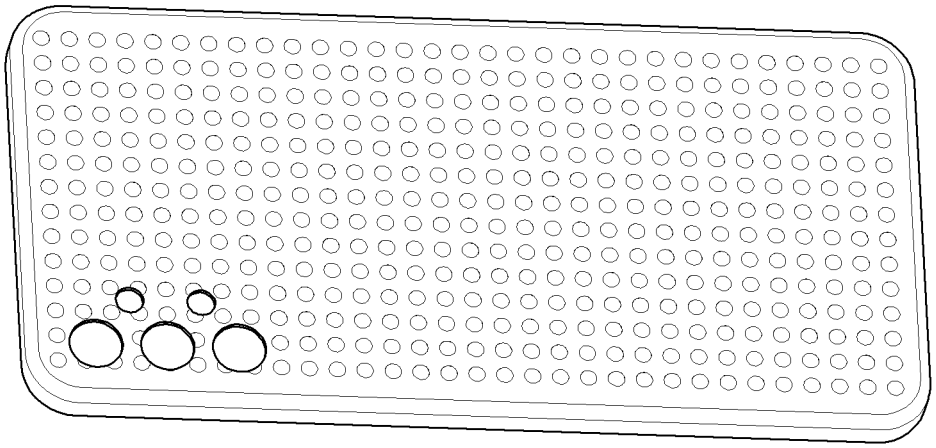

FIGS. 11A through 11C illustrate actual images of an electronic device to which an electronic device housing is applied, according to certain embodiments.

Referring to FIGS. 11A through 11C, a pattern formed by refraction and interference of light between first protrusions, second protrusions and third protrusions may be shown on a surface of the electronic device housing. According to an example embodiment, the electronic device housing may function as a plate forming a rear surface of an electronic device, may magnify an image, in a similar manner to a convex lens, due to refraction and/or interference of light by the first protrusions, the second protrusions, and the third protrusions included in the electronic device housing, and may form various types of patterns. In particular, the first protrusions and the second protrusions may be formed to partially overlap, and a pattern formed by a difference in depth between the first protrusions and the second protrusions may allow a user to feel a sense of perspective.

According to certain embodiments, the rear surface of the substrate of the electronic device housing may further include a plurality of fourth protrusions (e.g., the taper protrusions 932 of FIG. 9). According to certain embodiments, the electronic device may be at least one of a portable electronic device (e.g., a smartphone, a tablet PC, or a laptop) and a wearable electronic device (e.g., a smart watch).

Figure 12:
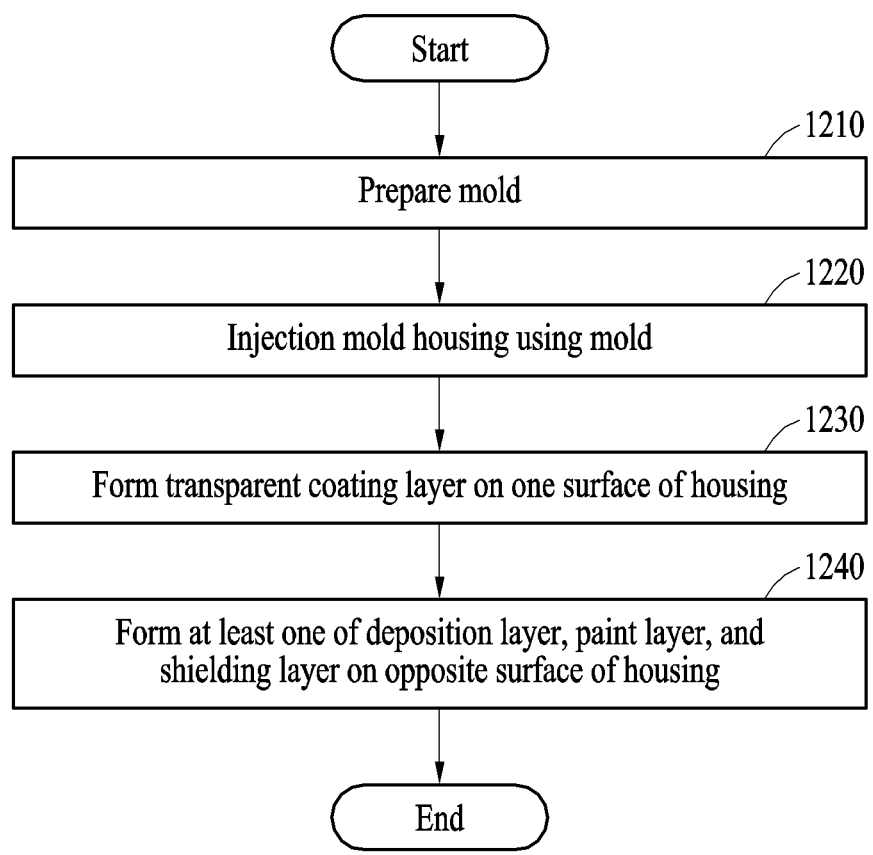
FIG. 12 is a flowchart illustrating a method of manufacturing an electronic device housing according to certain embodiments.

FIG. 12 is a flowchart illustrating a method of manufacturing an electronic device housing according to certain embodiments.

Referring to FIG. 12, the method of manufacturing an electronic device housing may include operation 1210 of preparing a mold, operation 1220 of injection molding a housing using the mold, operation 1230 of forming a transparent coating layer on one surface of the housing, and operation 1240 of forming at least one of a deposition layer, a paint layer, and a shielding layer on an opposite surface of the housing.

According to certain embodiments, the mold prepared by operation 1210 of preparing the mold may include a plurality of patterns. According to certain embodiments, the mold may include a first surface, and a second surface corresponding to the first surface. The first surface may include two or more patterns, for example, a first pattern and a second pattern, and the second surface may include a third pattern.

According to certain embodiments, the pattern included in the mold may be formed in an intaglio shape, and the electronic device housing formed by injection may have an embossed protrusion on a surface thereof. According to certain embodiments, the first surface of the mold may be formed by overlapping two or more patterns (e.g., a first pattern and a second pattern), and the two or more patterns may be different in at least one of a width, a depth, and a pitch. According to certain embodiments, the first pattern and the second pattern may include a plurality of dimples or a plurality of slits. In an area in which the first pattern and the second pattern overlap, an additional dimple may be formed on the dimples.

According to certain embodiments, the second surface of the mold may further include a fourth pattern overlapping the third pattern in addition to the third pattern. According to certain embodiments, the second surface of the mold may be formed by overlapping two or more patterns (e.g., a third pattern and a fourth pattern), and the two or more patterns may be different in at least one of a width, a depth, and a pitch. According to certain embodiments, the third pattern and the fourth pattern may include a plurality of dimples or a plurality of slits. In an area in which the third pattern and the fourth pattern overlap, an additional dimple may be formed on the dimples.

According to certain embodiments, the first pattern, the second pattern, and the third pattern may be formed by an engraving process. According to certain embodiments, the engraving process may refer to engraving a pattern of a specific shape on a mold using a tool, and a shape of the pattern engraved on the mold may be determined based on a shape of the tool. According to certain embodiments, the first pattern, the second pattern, and/or the third pattern may have a shape of at least one of a hemisphere, a hexahedron, a cylinder, and a triangular pyramid.

According to certain embodiments, operation 1220 of injection molding the housing may manufacture the electronic device housing on which a plurality of intaglio patterns engraved in the mold are transferred. According to certain embodiments, a housing or a substrate of the housing may be formed by injecting at least one polymer resin among SAN, PMMA, PC, ABS, PBT, PET, and POM into a mold, and may further include a UV curable resin to use UV molding for performing curing when UV rays are irradiated.

According to certain embodiments, operation 1240 of forming at least one of the deposition layer, the paint layer, and the shielding layer on the opposite surface of the housing may be performed on the opposite surface of the housing on which the transparent coating layer is formed. According to certain embodiments, the deposition layer, the paint layer, and the shielding layer may be formed regardless of order. According to an example embodiment, the deposition layer, the paint layer, and the shielding layer may be sequentially formed.

According to certain embodiments, the method may further include, after operation 1240 of forming at least one of the deposition layer, the paint layer, and the shielding layer on the opposite surface of the housing, an operation of computerized numerical control (CNC)-machining the housing.

Figure 13:
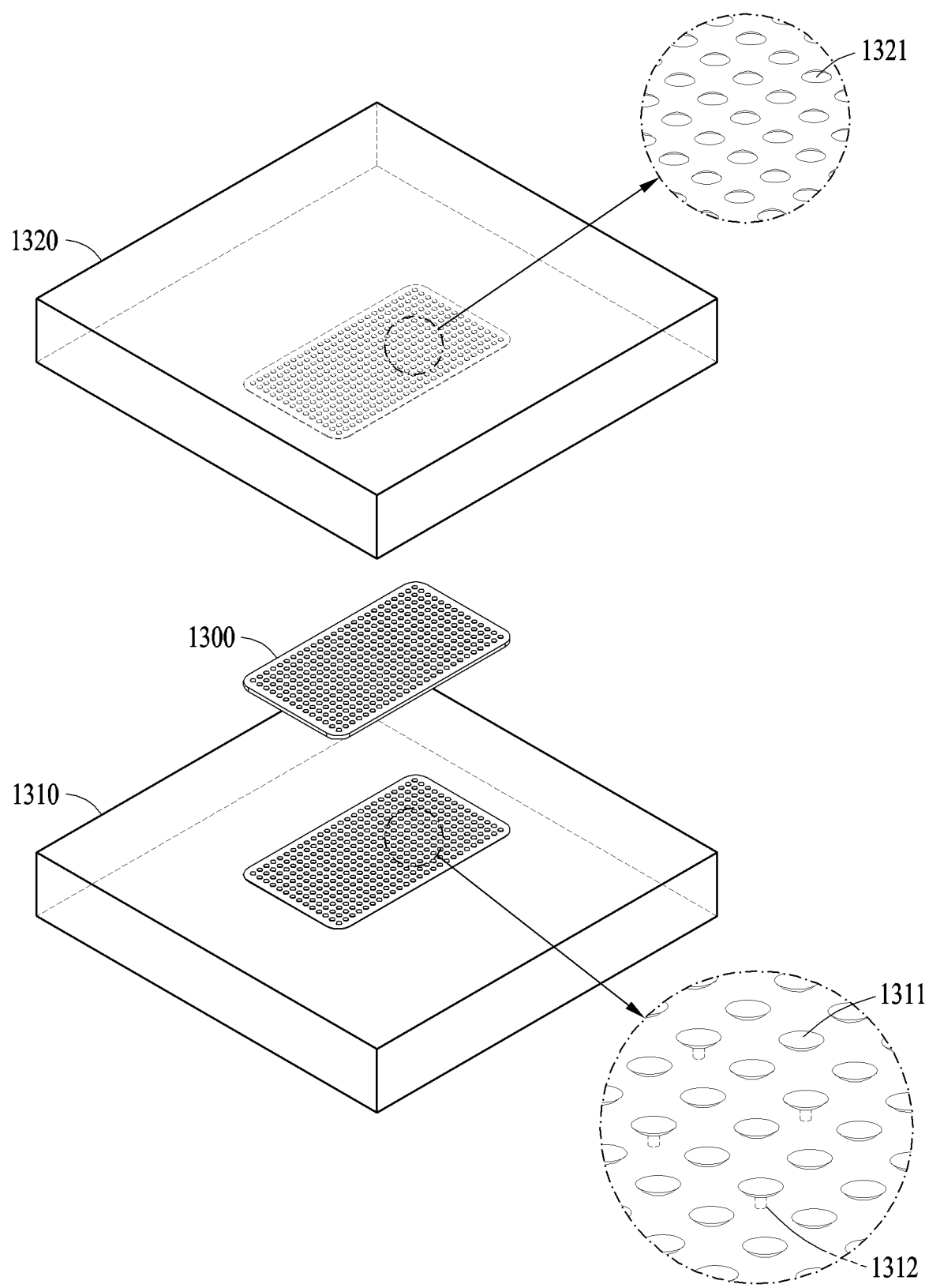
FIG. 13 is a perspective view of a mold for manufacturing an electronic device housing according to certain embodiments.

FIG. 13 is a perspective view of a mold for manufacturing an electronic device housing according to certain embodiments.

Referring to FIG. 13, molds 1310 and 1320 may be prepared to manufacture an electronic device housing 1300. According to certain embodiments, a mold may include a first mold 1310 for manufacturing a front surface of the electronic device housing 1300 and a second mold 1320 for manufacturing a rear surface of the electronic device housing 1300. According to certain embodiments, the first mold 1310 may include a first surface for manufacturing the front surface of the electronic device housing 1300, and the second mold 1320 may include a second surface for manufacturing the rear surface of the electronic device housing 1300.

According to certain embodiments, the first surface of the first mold 1310 may include two or more patterns, for example, a first pattern 1311 and a second pattern 1312. According to certain embodiments, the second surface of the second mold 1320 may include a third pattern 1321. According to certain embodiments, the electronic device housing 1300 may be molded by injecting a polymer resin between the first mold 1310 and the second mold 1320.

According to certain embodiments, the first pattern 1311, the second pattern 1312, and/or the third pattern 1321 may be formed in an intaglio shape, or may be formed in a hemispherical shape or a dimple shape. According to certain embodiments, the first pattern 1311 and the second pattern 1312 may partially overlap. In an area in which the first pattern 1311 and the second pattern 1312 overlap, an additional dimple may be formed on the dimples. According to certain embodiments, protrusions formed through the first pattern 1311, the second pattern 1312, and the third pattern 1321 may respectively correspond to the first protrusions (e.g., the front surface protrusions 421 of FIG. 4), the second protrusions (e.g., the taper protrusions 422 of FIG. 4), and the third protrusions (e.g., the rear surface protrusions 431 of FIG. 4) of the above-described electronic device housing (e.g., the electronic device housing 400 of FIG. 4).

FIGS. 14A through 14D illustrate images obtained by capturing a surface of a mold according to certain embodiments.

Figure 14D:
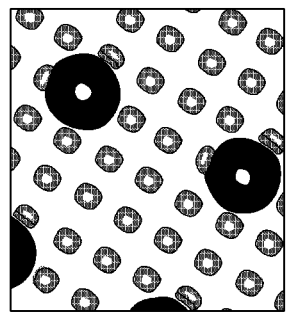
FIGS. 14A through 14D illustrate images obtained by capturing a surface of a mold according to certain embodiments.
Figure 14C:
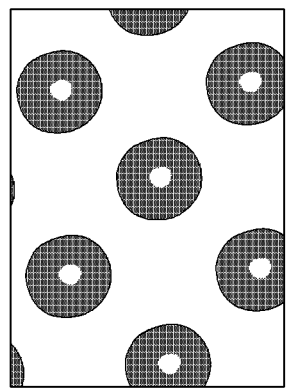
Figure 14B:
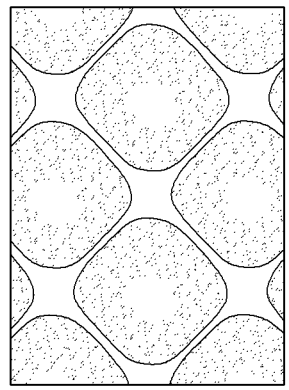
Figure 14A:
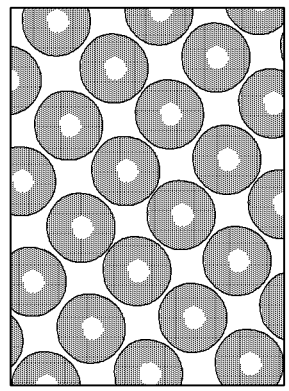

According to certain embodiments, the mold may include two or more patterns (e.g., the first pattern 1311 and the second pattern 1312 of FIG. 13). According to certain embodiments, a first pattern and a second pattern may be different from each other in at least one of a width, a depth, and a pitch, and a central axis of the first pattern and a central axis of the second pattern may be identical to or coincide with each other (FIGS. 14A, 14B, and 14C). According to certain embodiments, a pitch of the first pattern may be an integer multiple of a pitch of the second pattern. A central axis of at least one of first patterns may coincide with or substantially coincide with a central axis of at least one of second patterns (FIG. 14D).

The electronic device according to certain embodiments may be one of various types of electronic devices. The electronic device may include, for example, a portable communication device (e.g., a smartphone), a computer device, a portable multimedia device, a portable medical device, a camera, a wearable device, or a home appliance device. According to an example embodiment of the disclosure, the electronic device is not limited to those described above.

It should be appreciated that certain embodiments of the present disclosure and the terms used therein are not intended to limit the technological features set forth herein to particular example embodiments and include various changes, equivalents, or replacements for a corresponding example embodiment. Moreover, components of the foregoing embodiments, can be omitted, substituted, or supplemented without departing from the scope of this document. In connection with the description of the drawings, like reference numerals may be used for similar or related components. It is to be understood that a singular form of a noun corresponding to an item may include one or more of the things, unless the relevant context clearly indicates otherwise. As used herein, "A or B", "at least one of A and B", "at least one of A or B", "A, B or C", "at least one of A, B and C", and "A, B, or C," each of which may include any one of the items listed together in the corresponding one of the phrases, or all possible combinations thereof. Terms such as "first", "second", or "first" or "second" may simply be used to distinguish the component from other components in question, and may refer to components in other aspects (e.g., importance or order) is not limited. It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

What is claimed is:

1. An electronic device housing comprising:
   a substrate including:
   a front surface comprising a plurality of front surface protrusions and a plurality of taper protrusions protruding from the plurality of front surface protrusions and
   a rear surface comprising a plurality of rear surface protrusions; and
   wherein two protrusions selected from the plurality of front surface protrusions, the plurality of taper protrusions, and the plurality of rear surface protrusions are different from each remaining ones of the plurality of front surface protrusions, the plurality of taper protrusions, and the plurality of rear surface protrusions;
   a deposition layer formed on the front surface of the substrate; and
   a transparent coating layer formed on the rear surface of the substrate,
   a print layer formed between the transparent coating layer and the rear surface and partially or completely covering the rear surface,
   wherein tips of the plurality of taper protrusion comprise round shape.

2. The electronic device housing of claim 1, wherein at least one of the plurality of front surface protrusions, the plurality of taper protrusions and the plurality of rear surface protrusions has a shape of at least one of a hemisphere, a hexahedron, a cylinder, and a triangular pyramid.

3. The electronic device housing of claim 1, wherein a central axis of at least one of the plurality of front surface protrusions is identical to a central axis of at least one of the plurality of taper protrusions.

4. The electronic device housing of claim 1, wherein
   each of the plurality of front surface protrusions has a depth of 5 µm to 15 µm, and each of the plurality of taper protrusions has a depth of 20 µm to 30 µm.

5. The electronic device housing of claim 1, wherein a ratio between a depth of each of the plurality of front surface protrusions and a depth of each of the plurality of taper protrusions ranges from 1:1.5 to 1:4.

6. The electronic device housing of claim 1, wherein a pitch of each of the plurality of front surface protrusions is an integer multiple of a pitch of each of the plurality of taper protrusions.

7. The electronic device housing of claim 1, wherein
the rear surface further comprises another plurality of taper protrusions protruding from the plurality of rear surface protrusions, and
the plurality of rear surface protrusions and the another plurality of taper protrusions are different from each other in at least one of a width, a depth, and a pitch.

8. The electronic device housing of claim 1, wherein the electronic device housing has a transmittance of 50% or greater and a haze value of 30% or less.

9. The electronic device housing of claim 1, further comprising:
at least one of a paint layer and a shielding layer formed on the deposition layer.

10. The electronic device housing of claim 1, wherein the substrate comprises at least one selected from a group consisting of styrene-acrylonitrile (SAN), polymethyl methacrylate (PMMA), polycarbonate (PC), acrylonitrile butadiene styrene (ABS), polybutylene terephthalate (PBT), polyethylene terephthalate (PET), and polyoxymethylene (POM).

11. An electronic device housing comprising:
a substrate including:
a front surface comprising a plurality of front surface protrusions; and
a rear surface comprising a plurality of rear surface protrusions and a plurality of taper protrusions protruding from the plurality of rear surface protrusions; and
wherein two protrusions selected from the plurality of front surface protrusions, rear surface protrusions, and taper protrusions are different from each remaining one of the plurality of front surface protrusions, plurality of rear surface protrusions, and plurality of taper protrusions; and
a deposition layer formed on the front surface of the substrate; and
a transparent coating layer formed on the rear surface of the substrate,
a print layer formed between the transparent coating layer and the rear surface and partially or completely covering the rear surface,
wherein tips of the plurality of taper protrusion comprise round shape.

12. The electronic device housing of claim 11, wherein a central axis of at least one of the plurality of rear surface protrusions is identical to a central axis of at least one of the plurality of taper protrusions.

13. The electronic device housing of claim 11, wherein a ratio between a depth of each of the plurality of rear surface protrusions and a depth of each of the plurality of taper protrusions ranges from 1:1.5 to 1:4.

14. The electronic device housing of claim 11, wherein a pitch of each of the plurality of rear surface protrusions is an integer multiple of a pitch of each of the plurality of taper protrusions.

15. The electronic device housing of claim 11, further comprising:
at least one of a paint layer and a shielding layer formed on the deposition layer.

16. An electronic device enclosed by an electronic device housing, wherein the electronic device housing comprises:
a substrate including:
a front surface comprising a plurality of front surface protrusions and a plurality of taper protrusions protruding from the plurality of front surface protrusions, and
a rear surface comprising a plurality of rear surface protrusions; and
wherein two protrusions selected from the plurality of front surface protrusions, the plurality of taper protrusions, and the plurality of rear surface protrusions are different from remaining ones of the plurality of front surface protrusions, the plurality of taper protrusions, and the plurality of rear surface protrusions;
a deposition layer formed on the front surface of the substrate; and
a transparent coating layer formed on the rear surface of the substrate,
a print layer formed between the transparent coating layer and the rear surface and partially or completely covering the rear surface,
wherein tips of the plurality of taper protrusion comprise round shape.

17. The electronic device of claim 16, wherein the rear surface further comprises a another plurality of taper protrusions protruding from the plurality of rear surface protrusions.

18. The electronic device of claim 16, wherein a pattern formed by refraction and interference of light between the plurality of front surface protrusions, the plurality of taper protrusions, and the plurality of rear surface protrusions is shown on a surface of the electronic device housing.

* * * * *